(12) United States Patent
Onuma et al.

(10) Patent No.: US 9,504,207 B2
(45) Date of Patent: Nov. 29, 2016

(54) LIGHT EMITTING DEVICE

(71) Applicant: SHARP KABUSHIKI KAISHA, Osaka-shi, Osaka (JP)

(72) Inventors: Hiroaki Onuma, Osaka (JP); Masatsugu Masuda, Osaka (JP); Toshio Hata, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 14/655,454

(22) PCT Filed: Dec. 9, 2013

(86) PCT No.: PCT/JP2013/082911
§ 371 (c)(1),
(2) Date: Jun. 25, 2015

(87) PCT Pub. No.: WO2014/103671
PCT Pub. Date: Jul. 3, 2014

(65) Prior Publication Data
US 2015/0357532 A1 Dec. 10, 2015

(30) Foreign Application Priority Data

Dec. 28, 2012 (JP) ................................. 2012-287123

(51) Int. Cl.
| | | |
|---|---|---|
| *H01L 33/50* | (2010.01) | |
| *A01G 7/04* | (2006.01) | |
| *C09K 11/77* | (2006.01) | |
| *H01L 25/075* | (2006.01) | |

(52) U.S. Cl.
CPC ........... *A01G 7/045* (2013.01); *C09K 11/7708* (2013.01); *C09K 11/7734* (2013.01); *H01L 33/502* (2013.01); *H01L 33/504* (2013.01); *H01L 33/508* (2013.01); *H01L 25/0753* (2013.01); *H01L 2224/48091* (2013.01); *H01L 2224/48137* (2013.01); *Y02P 60/149* (2015.11)

(58) Field of Classification Search
CPC .............. A01G 7/045; C09K 11/7708; C09K 11/7734; H01L 33/50; H01L 33/502; H01L 33/504; H01L 33/508
See application file for complete search history.

(56) References Cited

U.S. PATENT DOCUMENTS

| | | | |
|---|---|---|---|
| 2008/0135863 A1* | 6/2008 | Onobuchi | G02B 6/4203 257/98 |
| 2009/0014741 A1 | 1/2009 | Masuda et al. | |
| 2014/0098529 A1 | 4/2014 | Hata et al. | |

FOREIGN PATENT DOCUMENTS

| | | |
|---|---|---|
| JP | 2002-199816 | 7/2002 |
| JP | 2006-324589 | 11/2006 |
| JP | 2009-019163 | 1/2009 |
| JP | 2009-094207 | 4/2009 |
| JP | 2010-029098 | 2/2010 |
| JP | 2011-155948 | 8/2011 |
| WO | WO2010/053341 | 5/2010 |
| WO | WO2012/165007 | 12/2012 |

OTHER PUBLICATIONS

International Search Report for PCT/JP2013/082911, mailed Jan. 28, 2014, 4 pages.

* cited by examiner

*Primary Examiner* — Whitney T Moore
(74) *Attorney, Agent, or Firm* — Nixon & Vanderhye P.C.

(57) ABSTRACT

This light emitting device is provided with: a light emitting element which emits excitation light; and a far-red phosphor which is excited by the light of the light emitting element and emits light that has a peak wavelength within the range of 700-800 nm. The far-red phosphor has a median diameter within the range of 1-20 μm.

16 Claims, 10 Drawing Sheets

LIGHT EMITTING DEVICE

This application is the U.S. national phase of International Application No. PCT/JP2013/082911 filed 9 Dec. 2013 which designated the U.S. and claims priority to JP Patent Application No. 2012-287123 filed 28 Dec. 2012, the entire contents of each of which are hereby incorporated by reference.

TECHNICAL FIELD

The present invention relates to light emitting devices.

BACKGROUND ART

The production and supply of plants such as vegetables and fruits are susceptible to drops due to climatic changes, pest damage, etc. On the other hand, today, with much attention paid to safe foods and higher food self-sufficiency, stable supply of safe plants is sought. This has brought about the development of technology for growing plants on factory equipment without using sunlight.

To grow a plant on factory equipment (in a plant factory), light (a source of light) is needed as a substitute for sunlight. Nowadays, light emitting elements such as LEDs (light-emitting diodes) are used as light sources in lighting devices for plant growth.

As is generally known, for efficient growth of plants in a plant factory, light having peak wavelengths in a plurality of wavelength regions is effective (peak wavelength denoting a wavelength at which a maximum relative radiation intensity is observed in a spectrum distribution). Superficially, effective is light having peak wavelengths in a wavelength range of 600 nm to 700 nm (light in this range is considered necessary for photosynthesis) and in a wavelength range of 400 nm to 480 nm (light in this range is considered necessary for proper morphogenesis of leaves).

Patent Document 1 identified below discloses a lighting device provided with a plurality of light emitting elements respectively having peak wavelengths in different wavelength regions. With this configuration, it is possible to irradiate a plant with light having peak wavelengths in different wavelength regions. However, provided with a plurality of light emitting elements, the configuration suffers from a complicated design of the drive circuit to accommodate the electrical and temperature characteristics of the individual light emitting elements, and from high cost resulting from the increased number of components. Moreover, a light emitting element having a peak wavelength in the wavelength range of 600 nm to 700 nm is typically fabricated by use of a compound, such as GaAlP, that is vulnerable to humidity, and thus requires some measure against humidity to be taken when used in a high-humidity environment as one suitable for plant growth.

Patent Document 2 identified below discloses a lighting device provided with a blue LED, a GGG (gadolinium-gallium-garnet) phosphor (far-red phosphor), and a red phosphor. With this configuration, it is possible to emit, as well as blue light, far-red and red light from the far-red and red phosphors, respectively, excited by excitation light from the blue LED.

LIST OF CITATIONS

Patent Literature

Patent Document 1: JP-A-2010-29098
Patent Document 2: WO 2010/053341

SUMMARY OF THE INVENTION

Technical Problem

According to Patent Document 2, light having peak wavelengths in a plurality of wavelength regions is produced by a combination of one light emitting element having a peak wavelength in a particular wavelength region with a plurality of phosphors. However, the use of a GGG phosphor is impractical because it tends to invite, with too small a median size (average particle size), incomplete crystal growth, resulting in a reduced amount of light and hence less efficient plant growth and, with too large a median size, abnormal crystal growth, resulting in coarse particles.

An object of the present invention is to provide an inexpensive light emitting device that allows efficient growth of plants.

Means for Solving the Problem

To achieve the above object, according to one aspect of the present invention, a light emitting device includes: a light emitting element which emits excitation light; and a far-red phosphor which, when excited by the excitation light from the light emitting element, emits light having a peak wavelength in a range of 700 nm to 800 nm. Here, the median size (average particle size) of the far-red phosphor is within a range of 1 μm to 20 μm.

In the light emitting device configured as described above, preferably, there may be further provided a red phosphor which, when excited by the excitation light from the light emitting element, emits light having a peak wavelength in a range of 600 nm to 700 nm.

In the light emitting device configured as described above, preferably, a phosphor layer containing the far-red phosphor and the red phosphor may be formed so as to reduce the absorption by the far-red phosphor of the light emitted from the red phosphor.

In the light emitting device configured as described above, preferably, the phosphor layer may have a first phosphor layer in which the concentration of the red phosphor is higher than the concentration of the far-red phosphor, and a second phosphor layer in which the concentration of the far-red phosphor is higher than the concentration of the red phosphor.

In the light emitting device configured as described above, preferably, the first phosphor layer may be arranged farther away from the light emitting element than the second phosphor layer is with respect to the emission direction of the excitation light.

In the light emitting device configured as described above, preferably, the first and second phosphor layers may be arranged in a direction perpendicular to the emission direction of the excitation light from the light emitting element.

In the light emitting device configured as described above, preferably, the first and second phosphor layers may be arranged in the shape of strips as seen in a top view so as to reduce the amount of light emitted from one to the other of the first and second phosphor layers.

In the light emitting device configured as described above, preferably, the specific gravity of the far-red phosphor may be greater than the specific gravity of the red phosphor.

In the light emitting device configured as described above, preferably, the far-red phosphor may have a specific gravity in a range of 6.5 to 7.5, and the red phosphor may have a specific gravity in a range of 2.0 to 4.0.

In the light emitting device configured as described above, preferably, the light emitting element may have a first light emitting element group which emits excitation light to the first phosphor layer, and a second light emitting element group which emits excitation light to the second phosphor layer, and the first and second light emitting element groups may be controllable to be lighted and extinguished individually.

In the light emitting device configured as described above, preferably, there may be further provided an anti-settling agent and/or a phosphor having a different wavelength with the light emitted from the described far-red and red phosphors excited by the excitation light from the light emitting element.

In the light emitting device configured as described above, preferably, the red phosphor may comprise at least one of red phosphors from a $CaAlSiN_3$:Eu-based component, a $(Sr,Ca)AlSiN_3$:Eu-based component, a $3.5MgO.0.5MgF_2.GeO_2$:Mn component, a $(Ca,Sr)S$:(Eu,Ce, K) component, and a $M_2Si_5N_8$:Eu component (where M is at least one element selected from the group consisting of Ca, Sr, and Ba).

In the light emitting device configured as described above, preferably, the red phosphor, when excited by the excitation light from the light emitting element, may emit light having a peak wavelength around 620 nm.

In the light emitting device configured as described above, preferably, the far-red phosphor may comprise a phosphor expressed by the chemical formula $(Ln_{1-x}Cr_x)_3 M_5O_{12}$ (where Ln is at least one element selected from the group consisting of Y, La, Gd, and Lu; M is at least one element selected from the group consisting of Al, Ga, and In; x is a number fulfilling the formula $0.005 \le x \le 0.2$).

Preferably, the light emitting device configured as described above may be used for plant cultivation.

Advantageous Effects of the Invention

According to the present invention, a light emitting device has a far-red phosphor that, when excited by excitation light from a light emitting element, emits far-red light, and the median size of the far-red phosphor is optimized to be in a range of 1 μm to 20 μm. Providing such a far-red phosphor allows adequate crystal growth, preventing incomplete crystal growth, or abnormal crystal growth resulting in coarse particles. Thus, the light emitting device produces brighter light, and allows more efficient growth of plants. Moreover, a phosphor layer containing the far-red phosphor or the red phosphor is formed to reduce the absorption of the light emitted from the red phosphor by the far-red phosphor. Thus, it improves the light output efficiency of the light emitting device, leading to more efficient growth of plants.

DESCRIPTION OF EMBODIMENTS

First Embodiment

Prior to a description of a first embodiment of the present invention, a brief description will be given of the growth of plants. Light acts as a source of stimuli and a source of information in plants' sprouting, flowering, stalk growth, etc. In plants, photosynthesis takes place as a result of chlorophyll absorbing light. The absorption of light by chlorophyll peaks in two wavelength regions, the first being a wavelength range of 400 nm to 500 nm (more specifically, around 450 nm) and the second being a wavelength range of 600 nm to 700 nm (more specifically, around 660 nm).

Light in the first region (blue light) is necessary for proper morphogenesis of leaves etc., and light in the second region (red light) is necessary for photosynthesis. Moreover, in cases where plants are irradiated with mixed light, far-red light is considered necessary for internode growth and sprout formation. Phytochrome in plants absorbs different types of light by undergoing reversible photoconversion between Pr-form phytochrome, which is a photoreceptive site for red light in a wavelength range of 600 nm to 700 nm, and Pfr-form phytochrome, which is a photoreceptive site for far-red light in a wavelength range of 700 nm to 800 nm. Thus, through adjustment of wavelength of light, photomorphogenic functions such as internode growth and sprout formation are suppressed or promoted.

Growth also depends on the ratio, R/FR, of the intensity of red light (R) to the intensity of far-red light (FR). Thus, by selectively or arbitrarily adjusting the R/FR, it is possible to control growth, e.g., to suppress or promote growth. Specifically, setting the R/FR higher than that (1.1 to 1.2) in a natural-light environment suppresses growth, and setting the former lower than the latter promotes growth.

Figure 1:
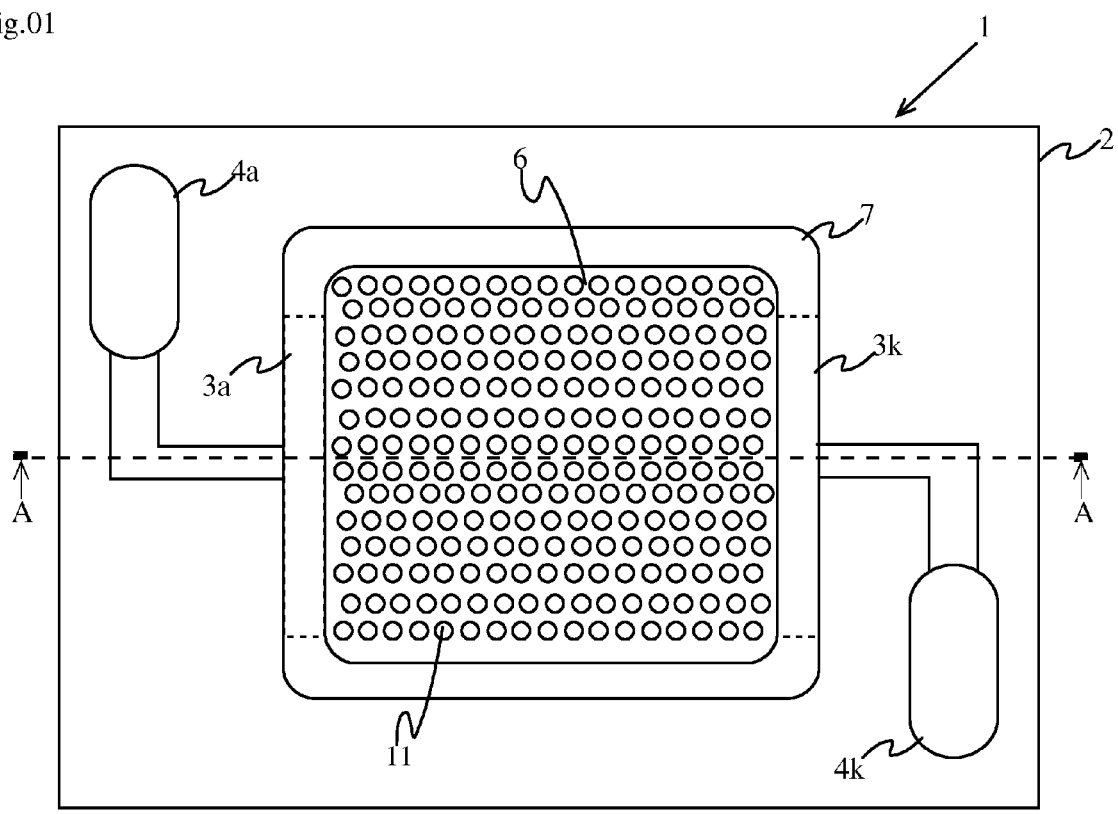
FIG. 1 A top view of a light emitting device according to a first embodiment of the present invention.
Figure 2:
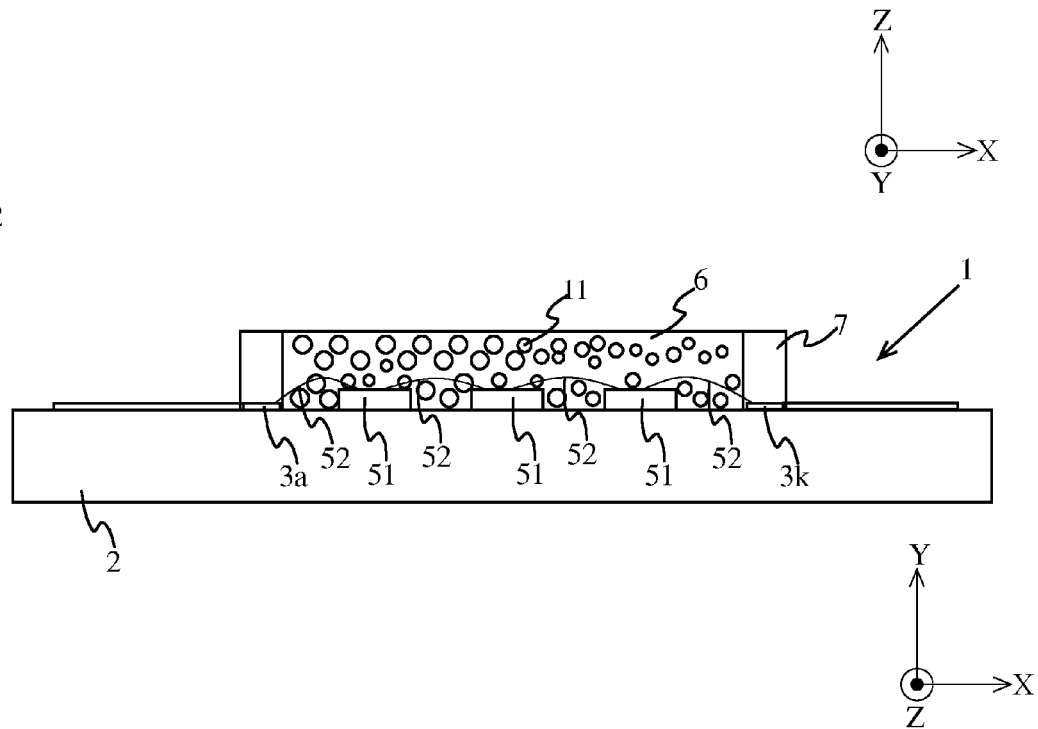
FIG. 2 A side sectional view of the light emitting device shown in FIG. 1, on an XY section across line A-A.
Figure 3:
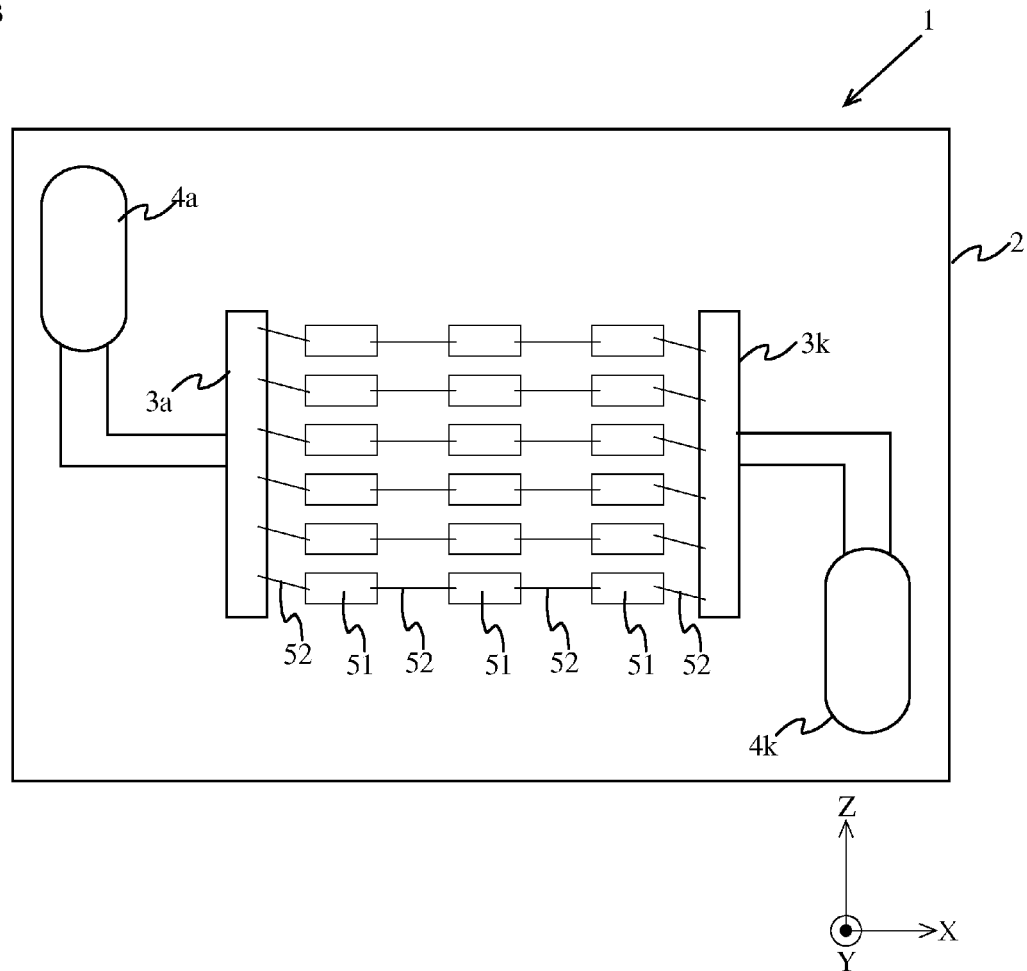
FIG. 3 A top view showing LEDs mounted on a substrate in the first embodiment.
Figure 4:
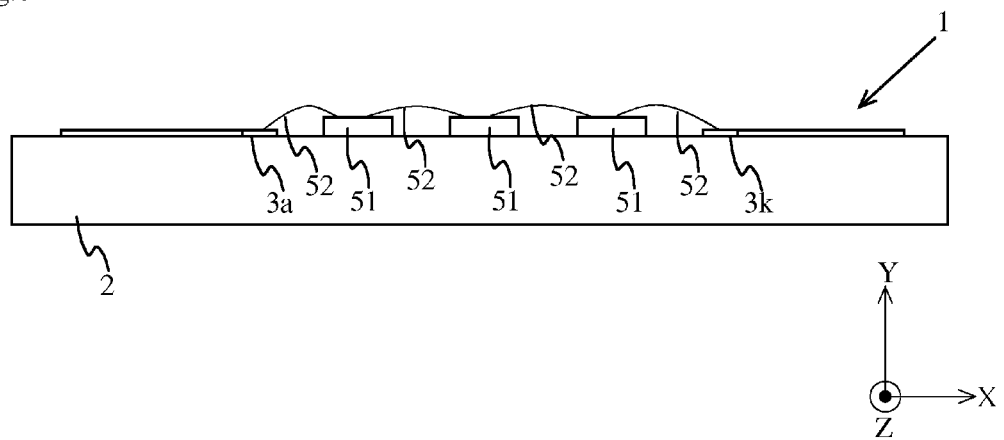
FIG. 4 A side view showing LEDs mounted on a substrate in the first embodiment.

Hereinafter, a first embodiment of the present invention will be described with reference to the accompanying drawings. FIG. 1 is a top view of a light emitting device according to the first embodiment. FIG. 2 is a side sectional view of the light emitting device shown in FIG. 1, as taken on an XY plane across line A-A. FIG. 3 is a top view showing LEDs mounted on a substrate in the first embodiment. FIG. 4 is a side view showing LEDs mounted on a substrate in the first embodiment. FIGS. 3 and 4 are the same views as FIGS. 1 and 2, respectively, except that the former two omit a phosphor layer and a resin frame.

For the sake of simple illustration, FIG. 1 also omits LEDs, which are shown in FIGS. 2, 3, and 4. Those LEDs in FIG. 1 may be visible, because, as will be described later, silicone resin is transparent. The same applies to FIGS. 5, 7, 11, 13, and 14, which will be described later.

In this embodiment, the light emitting device 1 includes a substrate 2, a conductor pattern 3, a electrode land 4, a light emitting element (LED, light-emitting diode) 5, a phosphor layer 6, and a resin frame 7. The substrate 2 is a ceramic substrate substantially in a rectangular shape as seen in a top view. The substrate 2 is not limited to a ceramic substrate; it may instead be a glass substrate, a printed circuit board, or the like. The conductor pattern 3 comprises conductor patterns 3a and 3k which are formed opposite each other on the substrate 2 by a screen printing process or the like. The conductor patterns 3a and 3k are each substantially in a rectangular shape as seen in a top view. This, however, is not meant to limit the shape of the conductor patterns; these may instead be each in the shape of an arc, like a cut-out part of a round loop as seen in a top view.

The substrate 2 has an LED 5, which will be described later, mounted on it and connected to the conductor pattern 3; thus, the light emitting device 1 is a light emitting device of a so-called chip-on-board type.

The electrode land 4 comprises electrode lands 4a and 4k which are formed, as electrodes to receive electric power at, on the substrate 2 out of a material such as Ag—Pt by a screen printing process or the like. The electrode land 4a and 4k is an anode and cathode electrode land, respectively. The electrode land 4a is connected to the conductor pattern 3a via a lead-out conductor, and the electrode land 4k is connected to the conductor pattern 3k via a lead-out conductor.

The LED 5 is a light emitting element (semiconductor light emitting element) which is mounted on the substrate 2. The LED 5 is composed of gallium nitride-based blue LED chips 51 which emit light having a peak wavelength in a wavelength range of 400 nm to 480 nm, more specifically around 450 nm, and which have good temperature and humidity characteristics. There is no particular limitation on the number of LED chips of which the LED 5 is composed; it may be composed of a single LED chip 51, or may be composed of a plurality of LED chips 51, the latter being assumed in this embodiment.

The LED 5 is composed of plural LED chips 51 arrayed in six parallel rows substantially parallel to one side of the substrate 2 (in the X direction), three LED chips 51 in each row. The three LED chips 51 in each row are electrically connected in series, and the six rows are electrically connected in parallel. Thus, the LED 5 is composed of a total of 18 LED chips 51. This, however, is not meant to limit how the LED chip 51 are electrically connected together and are arrayed in the LED 5.

The LED chips 51 in each row are connected one to the next via a conductive wire 52, and the LED chip 51 at each end of each row is connected to the conductor pattern 3 via a conductive wire 52. Although in this embodiment the LED 5 is assumed to emit light having a peak wavelength in a wavelength range of 400 nm to 480 nm, this is not meant as any limitation; it may emit light having a peak wavelength in a region below 400 nm covering ultraviolet light.

The phosphor layer 6 is a resin layer which fills inside the resin frame 7, which will be described later, so as to cover the LED 5. The phosphor layer 6 emits light having a peak wavelength in a predetermined range by excitation with the light (excitation light) emitted from the LED 5. The phosphor layer 6 is formed of sealing resin, which comprises silicone resin, containing a far-red phosphor (identified by reference sign 1 and indicated by circular symbols in FIG. 1, etc.) that emits light having a peak wavelength in a range of 700 nm to 800 nm when the phosphors are excited by excitation light from the LED 5.

This embodiment assumes the use, as the far-red phosphor, of a far-red phosphor based on gadolinium-gallium-garnet that emits light having a peak wavelength around 715 nm when excited by excitation light from the LED 5. This, however, is not meant to limit the type of far-red phosphor. The far-red phosphor based on gadolinium-gallium-garnet is not limited to $Gd_3Ga_5O_{12}$:Cr or any of its kind expressed by the general formula $(Ln_{1-x}Cr_x)_3M_5O_{12}$ (where Ln is a trivalent metal element, and is at least one element selected from the group consisting of Y, La, Gd, and Lu; M is a trivalent metal element, and is at least one element selected from the group consisting of Al, Ga, and In; x is a number fulfilling the formula $0.005 \leq x \leq 0.2$). As long as the desired properties are obtained, a composition proportion (e.g., M:O=5:12) may be altered, or a constituent element may be replaced with a similar element, or another element may be added, with a view to enhancing reliability, or adjusting, i.e., increasing or decreasing, emission and absorption spectra. In this embodiment, the far-red phosphor is assumed to be $Gd_3Ga_5O_{12}$:Cr.

As to the particle size of the far-red phosphor, it is preferable that the median size (average particle size) be in a range of 1 μm to 20 μm, more preferably in a range of 2 μm to 18 μm, and particularly preferably in a range of 3 μm to 15 μm. This is because, a phosphor based on gadolinium-gallium-garnet with a median size larger than 20 μm tends to produce abnormally grown coarse particles, and is thus difficult to use.

The resin frame 7 is a resin member which surrounds the phosphor layer 6 so that the phosphor layer 6 does not flow out of a predetermined area. The resin frame 7 is formed in the shape of a rectangular loop so as to cover the conductor pattern 3 (in FIG. 1, the conductor pattern 3 covered by the resin frame 7 is indicated by broken lines). This is not meant to limit the shape of the resin frame; it may be given any shape that so fits the shape of the conductor pattern 3 as to cover it. That is, in a case where the conductor pattern 3 is in the shape of an arc, like a cut-out part of a round loop, as described above, the resin frame 7 can be formed in the shape of a round loop. The LED 5 is arranged inside the resin frame 7, and the electrode land 4 is arranged outside the resin frame 7.

In the following description, the light emitted from the LED 5 is occasionally referred to as blue light, and the light emitted from the far-red phosphor 11 excited by excitation light from the LED 5 is occasionally referred to as far-red light.

The intensity ratio of blue and far-red light obtained by light emission from the LED 5 can be changed through adjustment of the proportion of the content of the far-red phosphor 11 in the sealing resin.

In this embodiment, the light emitted from the light emitting device 1 is blue and far-red light. Here, far-red light has a very low relative luminous efficiency, and the human eye is little sensitive to it; by contrast, blue light has a relative luminous efficiency several tens of times higher than far-red light. Thus, the human perceives the light from the light emitting device as blue. It is difficult to look straight at this light, and doing so induces a defense reaction, like looking away from it. Thus, as opposed to a light source emitting far-red light alone, it is possible to prevent adverse effects of far-red light on the human eye.

According to this embodiment, a light emitting device has a far-red phosphor that emits far-red light by excitation with from a light emitting element, and the median size of the far-red phosphor is optimized to be in a range of 1 μm to 20 μm. Such a far-red phosphor incomplete crystal growth, or abnormal growth leading to coarse particles. Thus, the light emitting device according to this embodiment produces brighter light, and allows more efficient growth of plants.

It is thus possible to realize a light emitting device that emits far-red light with a simple configuration, and with it, it is possible to promote, suppress, or otherwise control flowering. Also, the light emitting device is very convenient to use because it can emit far-red light for a short period after a light period (photo phase). Accordingly, it can be used suitably not only as an artificial light source for use in fully-closed factories but also as an auxiliary light source in plant factories exploiting sunlight.

Moreover, the use of LED elements that have a peak wavelength in a range of 400 nm to 480 nm allows blue light irradiation to plants, and blue light is important to plant growth. The LED 5 may comprise a single element, or may comprise a plurality of elements, which may be connected in series or in parallel. At least one light emitting device 1 can be mounted on a mounting substrate.

The phosphor layer 6 may contain a mixture of a far-red phosphor (indicated by circular symbols in FIG. 1, etc.) that emits light having a peak wavelength in a range of 700 nm to 800 nm by excitation with light from the LED 5 and a red phosphor (based on $CaAlSiN_3$:Eu) that emits light having a peak wavelength around 650 nm by excitation with light from the LED 5. The mixture may further comprise a red phosphor (based on $(Sr,Ca)AlSiN_3$:Eu) that emits light having a peak wavelength around 620 nm by excitation with light from the LED 5.

Part of the red light (with a wavelength around 620 nm) emitted from the red phosphor contained as one mixture component in the phosphor layer 6 is absorbed by the far-red phosphor 11 (indicated by circular symbols in FIG. 1, etc.) contained as another mixture component. However, owing to the phosphor layer 6 containing the red phosphor based on $(Sr,Ca)AlSiN_3$:Eu that emits light having a peak wavelength around 620 nm, the drop in the intensity of red light can be minimized. A description of embodiments in which the phosphor layer 6 contains a red phosphor is described below.

Second Embodiment

Figure 5:
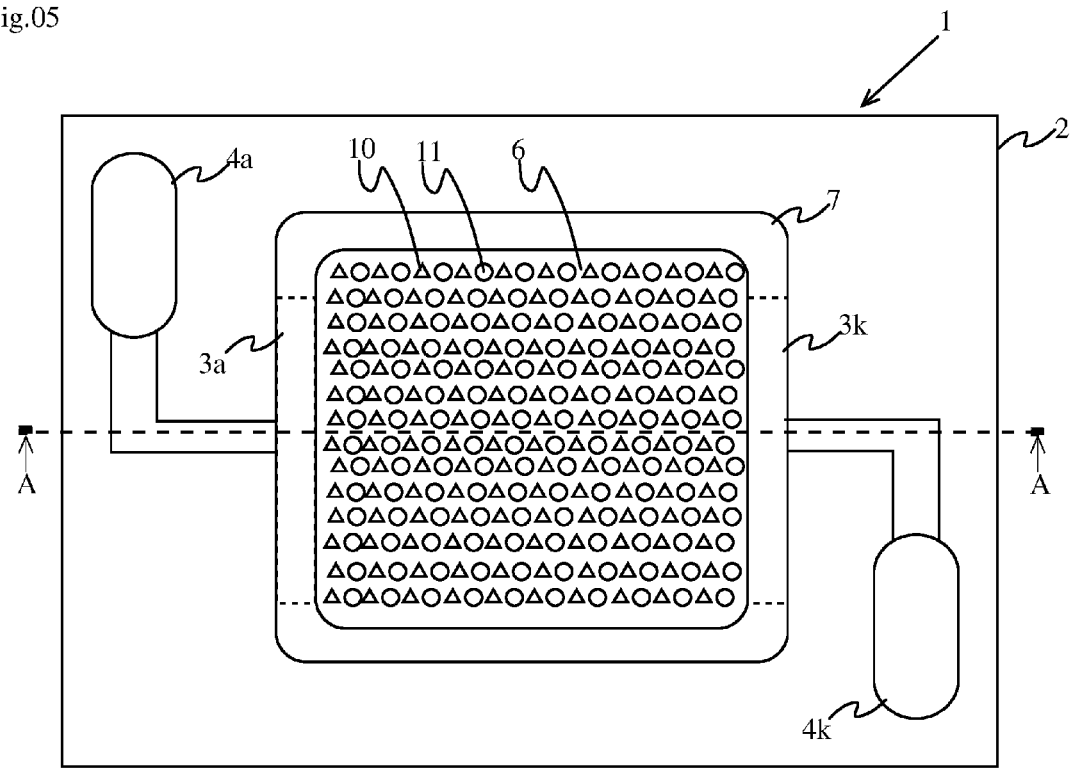
FIG. 5 A top view of a light emitting device according to a second embodiment of the present invention.
Figure 6:
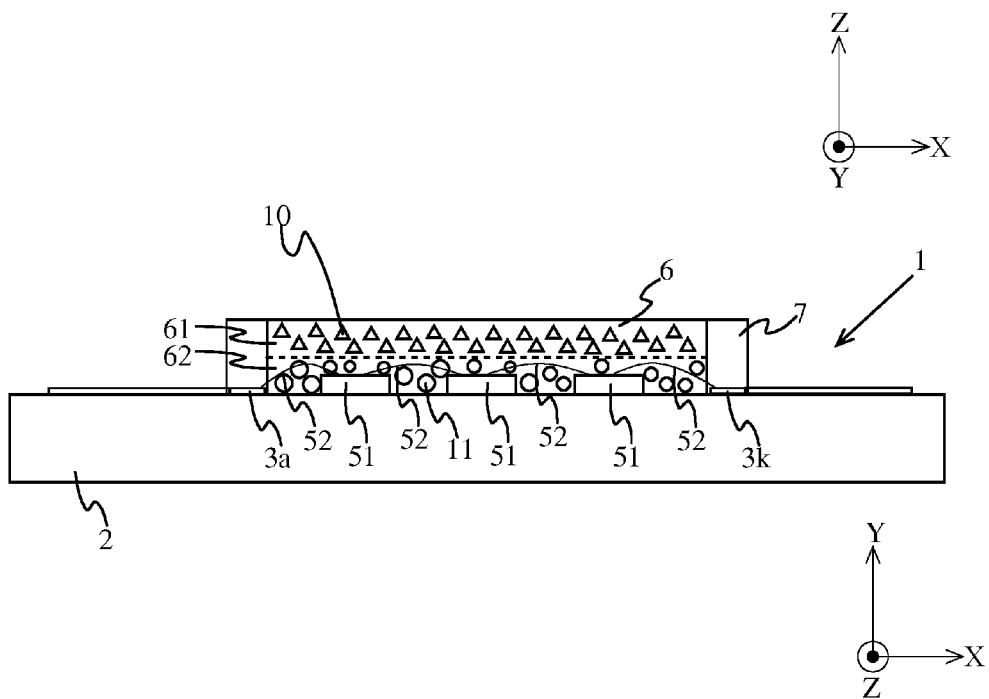
FIG. 6 A side sectional view of the light emitting device shown in FIG. 5, on an XY section across line A-A.

FIG. 5 is a top view of a light emitting device according to a second embodiment of the present invention. FIG. 6 is a side sectional view of the light emitting element shown in FIG. 5, taken on a YX section across line A-A. Here, the LED mounted on the substrate is similar to that in the first embodiment, and is therefore omitted from illustration. For such parts as find their counterparts in the first embodiment, no overlapping description will be repeated unless it is necessary.

The phosphor layer 6 is a resin layer which fills inside the resin frame 7 so as to cover the LED 5. The phosphor layer 6 emits light having a peak wavelength in a predetermined wavelength range by excitation with light (excitation light) emitted from the LED 5. The phosphor layer 6 is composed of a first phosphor layer 61 and a second phosphor layer 62. The first phosphor layer 61 is formed of sealing resin, which comprises silicone resin, containing a first phosphor 10 (indicated by triangular symbols in FIG. 5, etc.). The second phosphor layer 62 is formed of sealing resin, which comprises silicone resin, containing a second phosphor 11 (indicated by circular symbols in FIG. 5, etc.).

The first and second phosphor layers 61 and 62 are stacked on the mounting surface of the substrate 2 in two layers in the vertical direction (Y direction), with the first phosphor layer 61 formed over the second phosphor layer 62. The first phosphor 10 is a red phosphor that emits light having a peak wavelength in a range of 600 nm to 700 nm by excitation with light from the LED 5. The second phosphor 11 is a far-red phosphor that emits light having a peak wavelength in a range of 700 nm to 800 nm when excited by excitation light from the LED 5.

This embodiment assumes the use, as the red phosphor, of a phosphor based on $CaAlSiN_3$:Eu that emits light having a peak wavelength around 650 nm by excitation with light from the LED 5. This, however, is not meant to limit the type of red phosphor.

On the other hand, the embodiment assumes the use, as the far-red phosphor, of a phosphor based on gadolinium-gallium-garnet that emits light having a peak wavelength around 715 nm when excitation with light from the LED 5. This, however, is not meant to limit the type of far-red phosphor. The far-red phosphor based on gadolinium-gallium-garnet is not limited to $Gd_3Ga_5O_{12}$:Cr or any of its kind expressed by the general formula $(Ln_{1-x}Cr_x)_3M_5O_{12}$ (where Ln is a trivalent metal element, and is at least one element selected from the group consisting of Y, La, Gd, and Lu; M is a trivalent metal element, and is at least one element selected from the group consisting of Al, Ga, and In; x is a number fulfilling the formula $0.005 \leq x \leq 0.2$). So long as the desired properties are obtained, a composition proportion (e.g., M:O=5:12) may be altered, or a constituent element may be replaced with a similar element, or another element may be added, with a view to enhancing reliability, or adjusting, i.e., increasing or decreasing, emission and absorption spectra. In this embodiment, the far-red phosphor is assumed to be $Gd_3Ga_5O_{12}$:Cr.

As to the particle size of the far-red phosphor, it is preferable that the median size (average particle size) be in a range of 1 μm to 20 μm, more preferably in a range of 2 μm to 18 μm, and particularly preferably in a range of 3 μm to 15 μm. This is because, a far-red phosphor based on gadolinium-gallium-garnet with a median size larger than 20 μm tends to produce abnormally grown coarse particles, and is thus difficult to use.

In the following description, the first phosphor 10 is occasionally referred to as the red phosphor 10, and the second phosphor 11 is occasionally referred to as the far-red phosphor 11; the light emitted from the LED 5 is occasionally referred to as blue light, the light emitted from the red phosphor 10 by excitation with light from the LED 5 is occasionally referred to as red light, and the light emitted from the far-red phosphor 11 by excitation with light from the LED 5 is occasionally referred to as far-red light.

The proportion of the intensities of blue, red, and far-red light obtained when the LED 5 is can be adjusted by changing the proportion of the contents of the red and far-red phosphors 10 and 11 in the sealing resin.

As mentioned previously, the far-red phosphor 11 has a prominent absorption peak in a region of red light. Forming the first phosphor layer 61 over the second phosphor layer 62 as in this embodiment helps reduce the red light absorbed by the far-red phosphor 11. That is, with the first phosphor layer 61, which is arranged farther away from the LED 5 than the second phosphor layer 62 is with respect to its emission direction, it is possible to reduce the amount of light that is emitted from the first phosphor layer 61 but is absorbed by the second phosphor layer 62.

There is no particular limitation on the method by which to form the phosphor layer 6 in a two-layer structure composed of the first and second phosphor layers 61 and 62. Two exemplary methods will be described here. According to a first method of forming the phosphor layer 6, a process of applying resin containing phosphors is performed in a plurality of steps. Specifically, first the second phosphor layer 62 is formed on the substrate 2 so as to cover the LED 5, and then the first phosphor layer 61 is formed over the second phosphor layer 62.

A second method of forming the phosphor layer 6 exploits a difference in specific gravity. Specifically, whereas $Gd_3Ga_5O_{12}$:Cr has a specific gravity of 6.5 to 7.5, $CaAlSiN_3$:Eu has a specific gravity of 2.0 to 4.0 (in this embodiment, 3.2). Owing to the use of the far-red phosphor with a higher specific gravity than the red phosphor, during manufacture, when the two phosphors are added to the sealing resin and their respective layers are stacked as shown in FIG. 6 (with the substrate 2 at bottom), the phosphors exhibit different sedimentation velocities in uncured sealing resin, and separate into two layers. Here, however, it is difficult to separate the two layers completely, and thus the first and second phosphor layers 61 and 62 each contain both the red and far-red phosphors; complete separation is not essential.

It is however preferable that, in the first phosphor layer 61, the concentration of the red phosphor 10 is higher than the concentration of the far-red phosphor 11, and that, in the second phosphor layer 62, the concentration of the far-red phosphor 11 is higher than the concentration of the red phosphor 10. With this configuration, part of the red light emitted from the small amount of red phosphor 10 contained in the second phosphor layer 62 is absorbed by the small amount of far-red phosphor 11 contained in the first phosphor layer 61. Even then, since most of the red phosphor 10 is contained in the first phosphor layer 61, the drop in the intensity of red light can be minimized.

In this embodiment, the light emitted from the light emitting device 1 is red, blue, and far-red light. Although far-red light has a very low relative luminous efficiency and the human eye is little sensitive to it, owing to the presence of red and blue light, it is difficult to look straight at the light, and doing so induces a defense reaction, like looking away from it. Thus, as opposed to a light source that emits far-red light alone, it is possible to prevent adverse effects of far-red light on the human eye.

This embodiment provides an effect similar to that brought about by the first embodiment, and is in addition provided with a red phosphor that emits red light by excitation with light from the light emitting element. It is thus possible to realize a light emitting device that emits far-red and red light with a simple configuration, and irradiation of far-red and red light at same time from the light emitting device in this embodiment can promote efficient photosynthesis exploiting the Emerson effect (referring to the fact that, while the action spectrum for photosynthesis sharply drops in a long-wavelength region, irradiating plants with far-red light simultaneously with red and/or blue light promotes their photosynthesis). Accordingly, the light emitting device can be used suitably not only as an artificial light source for use in fully-closed factories but also as an auxiliary light source in plant factories exploiting sunlight.

Moreover, owing to the phosphor layer containing far-red and red phosphors being formed so as to reduce absorption by the far-red phosphor of light emitted from the red phosphor, it is possible to reduce absorption of red light by the far-red phosphor.

Moreover, the phosphor layer has a first phosphor layer in which the concentration of the red phosphor is higher than the concentration of the far-red phosphor and a second phosphor layer in which the concentration of the far-red phosphor is higher than the concentration of the red phosphor. Accordingly, the intensity of red light emitted from the second phosphor layer is zero or low, and thus the attenuation of the intensity of red light due to absorption of red light by the first phosphor layer containing no or a small amount of far-red phosphor is very limited.

Moreover, owing to the first phosphor layer being arranged farther away from the light emitting element than the second phosphor layer is with respect to the emission direction of the excitation light from the light emitting element, it is possible to reduce the amount of light emitted from the first phosphor layer to the second phosphor layer. With this configuration, it is possible to further reduce absorption of red light by the second phosphor layer.

Third Embodiment

Figure 7:
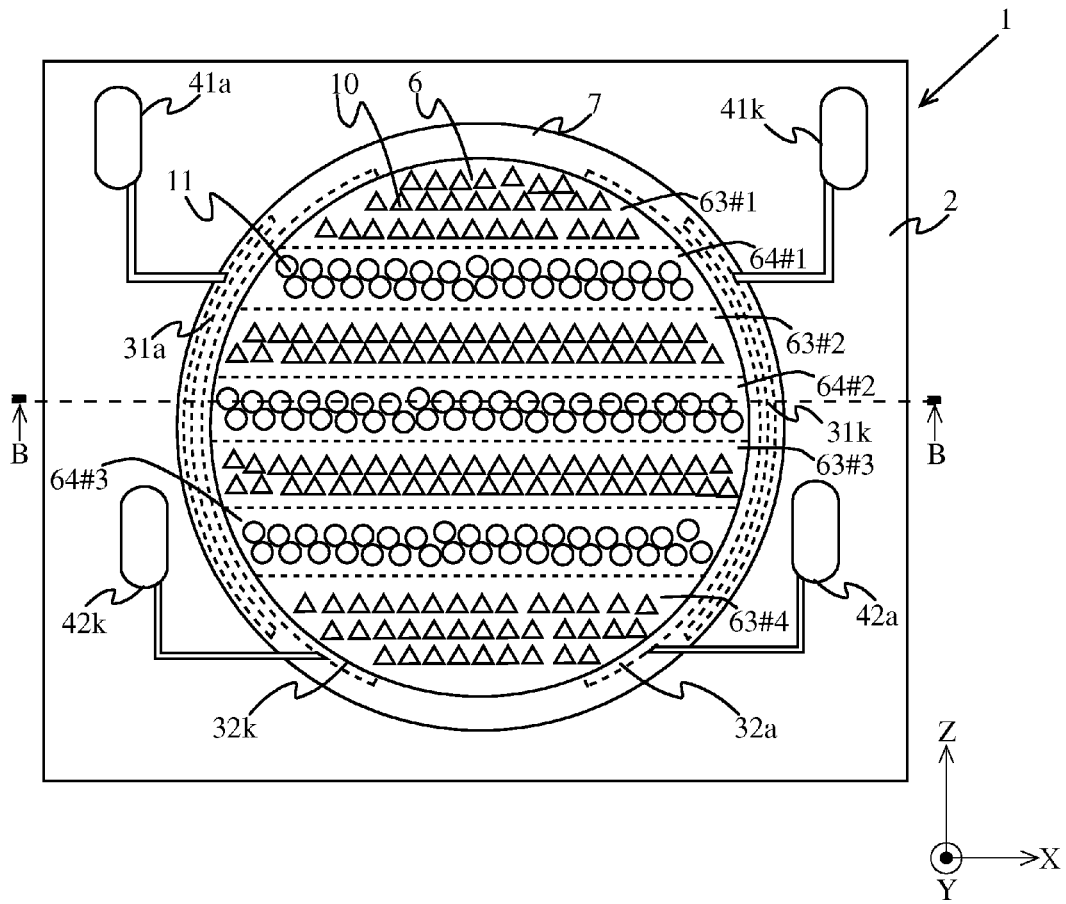
FIG. 7 A top view of a light emitting device according to a third embodiment of the present invention.
Figure 8:
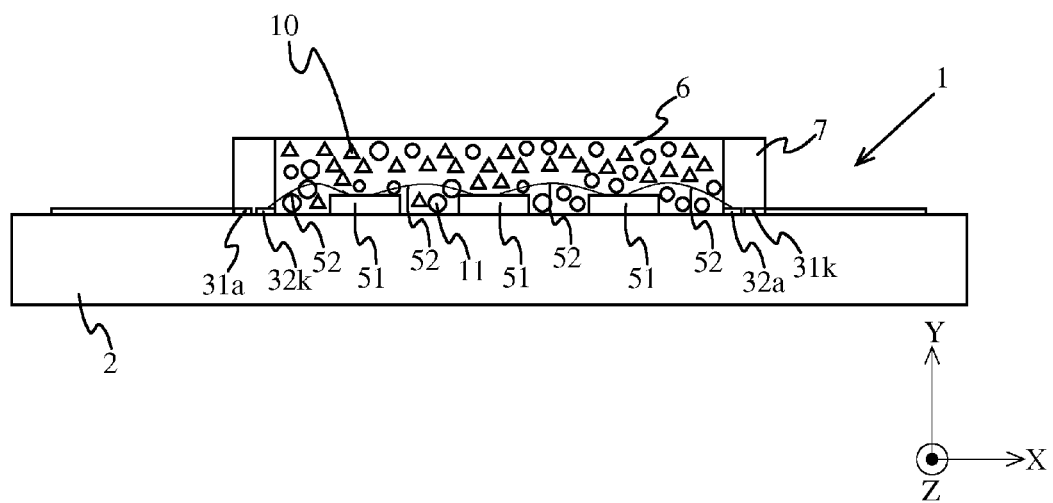
FIG. 8 A side sectional view of the light emitting device shown in FIG. 7, on an XY section across line B-B.
Figure 9:
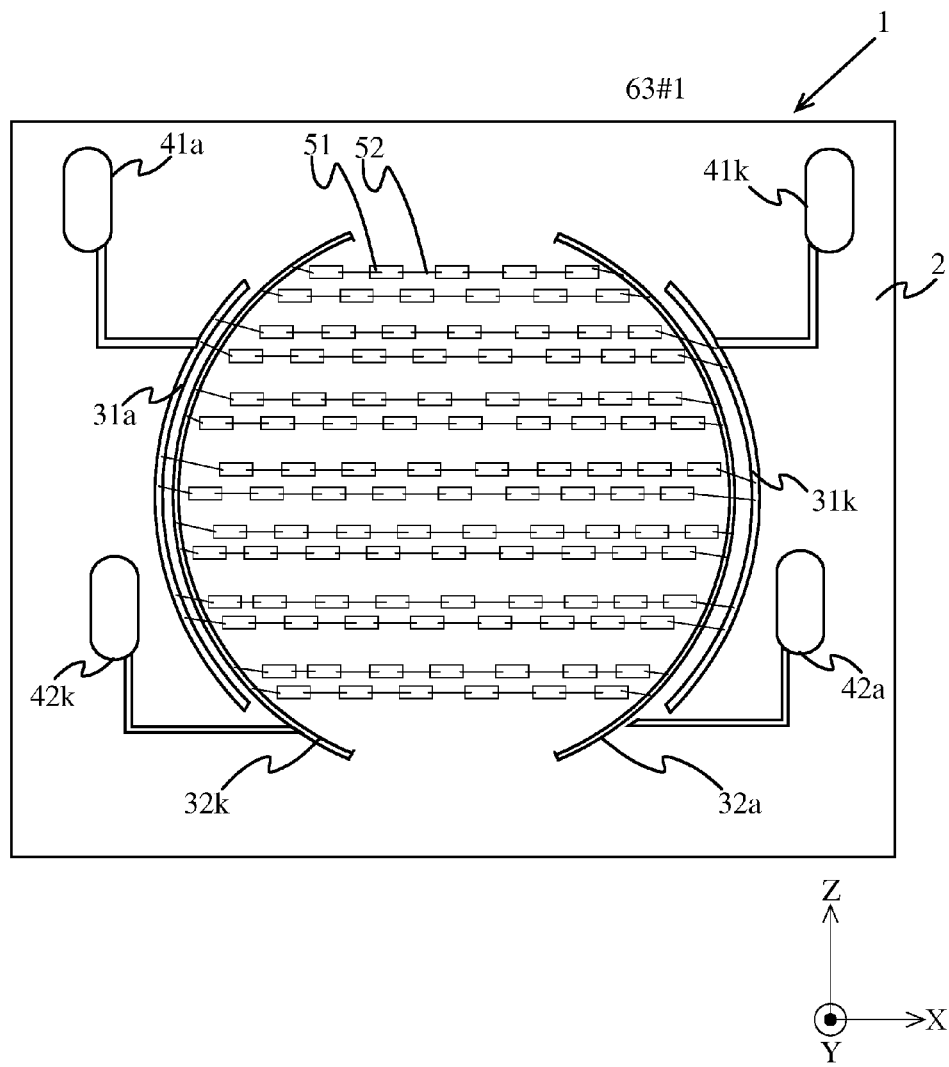
FIG. 9 A top view showing LEDs mounted on a substrate in the third embodiment.
Figure 10:
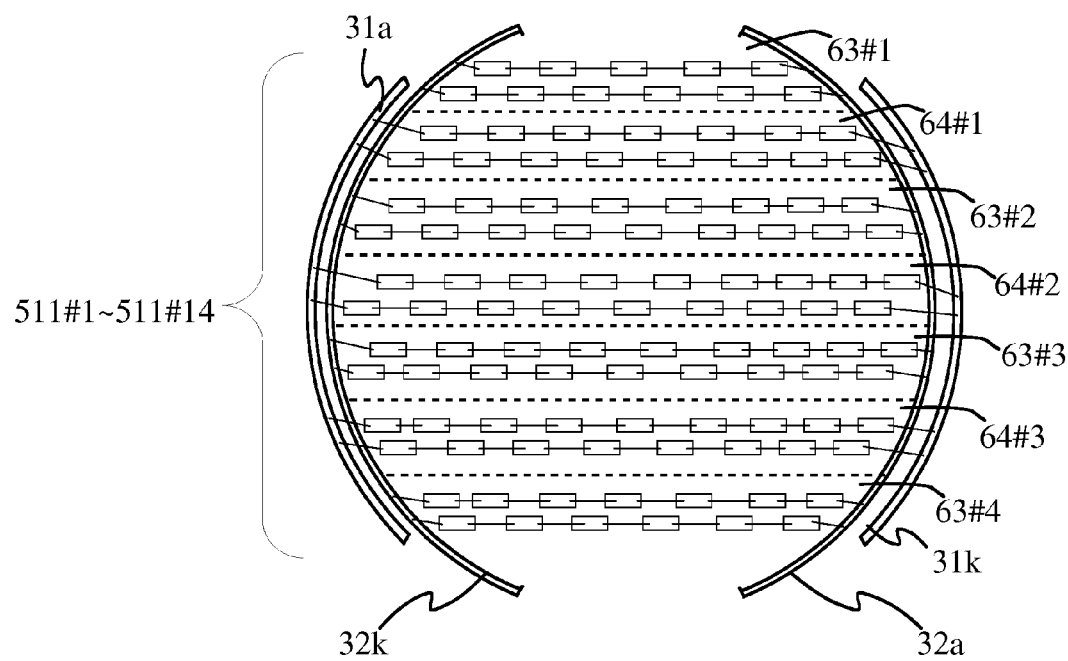
FIG. 10 A schematic diagram showing a positional relationship between phosphor layers and LEDs.

FIG. 7 is a top view showing a light emitting device according to a third embodiment of the present invention. FIG. 8 is a side sectional view of the light emitting device shown in FIG. 7, taken on an XY section across line B-B. FIG. 9 is a top view showing LEDs mounted on a substrate in the third embodiment. FIG. 10 is a schematic diagram showing a positional relationship between phosphor layers and LEDs. In FIG. 10, for an easy grasp of the positional relationship between phosphor layers and LEDs, triangular and circular symbols indicating the first and second phosphors 10 and 11, respectively, are omitted.

In the second embodiment described previously, the absorption of red light by the second phosphor layer 62 is reduced by stacking the first phosphor layer 61 over the second phosphor layer 62. In this embodiment, the absorption of red light by the second phosphor layer 62 is reduced without stacking the first and second phosphor layers together.

In this embodiment, the light emitting device 1 includes a substrate 2, a conductor pattern 3, an electrode land 4, a light emitting element (LED) 5, a phosphor layer 6, and a resin frame 7. The substrate 2 is a ceramic substrate substantially in a rectangular shape as seen in a top view. The substrate 2, however, is not limited to a ceramic substrate; it may instead be a glass substrate, a printed circuit board, or the like. The conductor pattern 3 comprises conductor patterns 31a, 31k 32a, and 32k which are formed on the substrate 2 by a screen printing process or the like, with the conductor patterns 31a and 31k opposite each other and the conductor patterns 32a and 32k opposite each other. The conductor patterns 31a, 31k 32a, and 32k are each substantially in the shape of an arc, like a cut-out part of a round loop as seen in a top view. This, however, is not meant to limit the shape of the conductor patterns; these may instead be each, for example, in a rectangular shape as seen in a top view as in the first embodiment.

The substrate 2 has the LED 5, which will be described later, mounted on it and connected to the conductor pattern 3; thus, the light emitting device 1 is a light emitting device of a so-called chip-on-board type.

The electrode land 4 comprises electrode lands 41a, 41k, 42a, and 42k which are formed, as electrodes to receive electric power at, on the substrate 2 out of a material such as Ag—Pt by a screen printing process or the like. The electrode lands 41a and 42a are anode electrode lands, and the electrode lands 41k and 42k re cathode electrode lands. The electrode land 41a is connected to the conductor pattern 31a via a lead-out conductor, and the electrode land 41k is connected to the conductor pattern 31k via a lead-out conductor. Likewise, the electrode land 42a is connected to the conductor pattern 32a via a lead-out conductor, and the electrode land 42k is connected to the conductor pattern 32k via a lead-out conductor.

The LED 5 is a light emitting element (semiconductor light emitting element) which is mounted on the substrate 2. The LED 5 is composed of gallium nitride-based blue LED chips 51 which emit light having a peak wavelength in a range of 400 nm to 480 nm, more specifically around 450 nm, and which have good temperature and humidity characteristics. There is no particular limitation on the number of LED chips of which the LED 5 is composed; it may be composed of a single LED chip 51, or may be composed of a plurality of LED chips 51, the latter being assumed in this embodiment.

The LED 5 is composed of a plurality of LED chips 51 arrayed in 14 parallel rows substantially parallel to one side of the substrate 2 (in the X direction), N LED chips 51 in each row (where N is a natural number). The N LED chips 51 in each row are electrically connected in series, and the 14 rows are electrically connected in parallel. In the following description, "N LED chips 51 electrically connected in series" are occasionally referred to as an "LED chip row 511." In this embodiment, 14 such LED chip rows 511 are arranged in parallel, which are individually referred to as LED chip rows 511#1 to 511#14 (see FIG. 10).

The LED chips 51 in each row are connected one to the next via a conductive wire 52, and the LED chip 51 at each end of each row is connected to the conductor pattern 3 via a conductive wire 52. Although in this embodiment the LED 5 is assumed to emit light having a peak wavelength in a range of 400 nm to 480 nm, this is not meant as any limitation; it may emit light having a peak wavelength in a region below 400 nm covering ultraviolet light.

The phosphor layer 6 is a resin layer which fills inside the resin frame 7 so as to cover the LED 5. The phosphor layer 6 emits light having a peak wavelength in a predetermined wavelength range by excitation with light (excitation light) emitted from the LED 5. The phosphor layer 6 is composed of a first phosphor layer 63 and a second phosphor layer 64. The first phosphor layer 63 is formed of sealing resin, which comprises silicone resin, containing a first phosphor 10 (indicated by triangular symbols in FIG. 7, etc.). The second phosphor layer 64 is formed of sealing resin, which comprises silicone resin, containing a second phosphor 11 (indicated by circular symbols in FIG. 7, etc.).

The first phosphor 10 is a red phosphor that emits light having a peak wavelength in a wavelength range of 600 nm to 700 nm when excited by excitation light from the LED 5. The first phosphor 11 is a far-red phosphor that emits light having a peak wavelength in a wavelength range of 700 nm to 800 nm when excited by excitation light from the LED 5.

This embodiment assumes the use, as the red phosphor, of a phosphor based on $CaAlSiN_3$:Eu that emits light having a peak wavelength around 650 nm by excitation with light from the LED 5. This, however, is not meant to limit the type of red phosphor.

On the other hand, the embodiment assumes the use, as the far-red phosphor, of a phosphor based on gadolinium-gallium-garnet that emits light having a peak wavelength around 715 nm by excitation with light from the LED 5. This, however, is not meant to limit the type of far-red phosphor. The far-red phosphor based on gadolinium-gallium-garnet is not limited to $Gd_3Ga_5O_{12}$:Cr or any of its kind expressed by the general formula $(Ln_{1-x}Cr_x)_3M_5O_{12}$ (where Ln is a trivalent metal element, and is at least one element selected from the group consisting of Y, La, Gd, and Lu; M is a trivalent metal element, and is at least one element selected from the group consisting of Al, Ga, and In; x is a number fulfilling the formula $0.005 \leq x \leq 0.2$). So long as the desired properties are obtained, a composition proportion (e.g., M:O=5:12) may be altered, or a constituent element may be replaced with a similar element, or another element may be added, with a view to enhancing reliability, or adjusting, i.e., increasing or decreasing, emission and absorption spectra. In this embodiment, the far-red phosphor is assumed to be $Gd_3Ga_5O_{12}$:Cr.

While there is no particular restriction on the particle size of the far-red phosphor, it is preferable that the median size (average particle size) be in a range of 1 μm to 20 μm, more preferably in a range of 2 μm to 18 μm, and particularly preferably in a range of 3 μm to 15 μm. This is because, a far-red phosphor based on gadolinium-gallium-garnet with a median size larger than 20 μm tends to produce abnormally grown coarse particles, and is thus difficult to use.

The first and second phosphor layers 63 and 64 are formed in the shape of strips, alternately in the lengthwise direction of the conductor pattern 3 (i.e., in the Z direction, in other words in the direction perpendicular to the emission direction (Y direction) of the excitation light from the LED 5) as seen in a top view. That is, of the first and second phosphor layers 63 and 64, one is formed in a region demarcated by the other and by the resin frame 7 such that the first phosphor layer 63 comprises four first phosphor layers 63#1 to 63#4 formed in separate regions and that the second phosphor layer 64 comprises four second phosphor layers 64#1 to 64#4 formed in separate regions.

As shown in FIG. 10, the LED chip rows 511 are arranged in pairs of two rows so as to irradiate the first phosphor layers 63#1 to 63#4 and the second phosphor layers 64#1 to 64#4 respectively with excitation light. In other words, two LED chip rows 511 are under each phosphor layer. For example, as shown in FIG. 10, the first phosphor layer 63#1 is irradiated with the excitation light mainly from the LED chip rows 511#1 and 511#2. Likewise, the other phosphor layers are each irradiated with excitation light from two LED chip rows 511 in a pair.

Between two LED chip rows 511 that irradiate the same phosphor layer with excitation light, the LED chips 51 in one LED chip row 511 and the conductive wires 52 in the other LED chip row 511 are arranged in a zigzag manner so as to overlap as seen from the direction (Z direction) perpendicular to the row direction (X direction) of the LED chips 51. This configuration helps alleviate uneven brightness of the light emitted from the light emitting device 1.

In this embodiment, the first phosphor layer 63 is formed in four regions, and the second phosphor layer 64 is formed in three regions. This, however, is not meant to limit the numbers of regions in which the first and second phosphor layers 63 and 64 are respectively formed. Nor is there any limitation on the numbers of rows in which to arrange LED chips under the first and second phosphor layers 63 and 64 respectively; the numbers may be one, or three or more.

The resin frame 7 is a resin member which surrounds the phosphor layer 6 so that the phosphor layer 6 does not flow out of a predetermined area. The resin frame 7 is formed substantially in the shape of a round loop so as to cover the conductor pattern 3 (in FIG. 7, the conductor pattern 3 covered by the resin frame 7 is indicated by broken lines). This is not meant to limit the shape of the resin frame; it may be given any shape that so fits the shape of the conductor pattern 3 as to cover it. That is, in a case where the conductor pattern 3 is substantially in a rectangular shape as described above, the resin frame 7 can be formed in the shape of a rectangular loop. The LED 5 is arranged inside the resin frame 7, and the electrode land 4 is arranged outside the resin frame 7.

In the following description, as in the second embodiment, the first phosphor 10 is occasionally referred to as the red phosphor 10, and the second phosphor 11 is occasionally referred to as the far-red phosphor 11; the light emitted from the LED 5 is occasionally referred to as blue light, the light emitted from the red phosphor 10 by excitation with light from the LED 5 is occasionally referred to as red light, and the light emitted from the far-red phosphor 11 by excitation with light from the LED 5 is occasionally referred to as far-red light.

As mentioned previously, the far-red phosphor 11 has a prominent absorption peak in a region of red light. Arranging the first and second phosphor layers 63 and 64 in the shape of strips as in this embodiment helps reduce the red light absorbed by the far-red phosphor 11. That is, with the first and second phosphor layers 63 and 64 so arranged, the amount of light emitted from one phosphor layer to the other is reduced. Thus, the absorption by the second phosphor layer 64 of the light emitted from the first phosphor layer 63 is reduced; that is, the absorption of red light by the far-red phosphor 11 is reduced.

There is no particular limitation on the method to form the first and second phosphor layers 63 and 64 in the shape of strips as described above. One exemplary method will be described here. In this embodiment, as the sealing resin that contains the red phosphor 10 and/or the far-red phosphor 11, silicone resin with high thixotropy and no flowability is used. Discussed in detail below is a case where silicone resin with high thixotropy and no flowability is used as the sealing resin containing the far-red phosphor 11.

First, on the substrate 2, the second phosphor layer 64 is formed in the shape of strips, in three regions a predetermined distance apart from one another, so as to cover part of the LED 5. The three regions may be defined by use of a mold or the like, or, considering that the second phosphor layer 64 comprises silicone resin with high thixotropy and no flowability as mentioned above, may be defined arbitrarily without use of a mold or the like. The so formed second phosphor layer 64 serves as resin walls, and thus, along with the resin frame 7, defines regions in which to form the first phosphor layer 63.

Then, the three regions formed between the resin frame 7 and the second phosphor layer 64 are filled with silicone resin containing the red phosphor 10, and thus the first phosphor layer 63 is formed.

As in the second embodiment, the first and second phosphor layers 63 and 64 may each contain both the red and far-red phosphors 10 and 11. In that case, it is preferable that, in the first phosphor layer 63, the concentration of the red phosphor 10 is higher than the concentration of the far-red phosphor 11, and that, in the second phosphor layer 64, the concentration of the far-red phosphor 11 is higher than the concentration of the red phosphor 10.

The intensity ratio of blue, red, and far-red light obtained by the LED 5 emission can be adjusted by changing the proportion of the contents of the red and far-red phosphors 10 and 11 in the sealing resin. In addition, in this embodiment, there are provided two anode electrode lands (41a, 42a) and two cathode electrode lands (41k, 42k). Of the LED chips 51 at both ends of the LED chip rows 511 arranged right under the first phosphor layer 63#1 to 63#4, those at one end are connected to the same conductor pattern 32a, and those at the other end are connected to the same conductor pattern 32k. Likewise, of the LED chips 51 at both ends of the LED chip rows 511 arranged right under the second phosphor layer 64#1 to 64#4, those at one end are connected to the same conductor pattern 31a, and those at the other end are connected to the same conductor pattern 31k.

With this configuration, the LED chip rows 511 arranged under the first phosphor layers 63#1 to 63#4 (a first LED group) and the LED chip rows 511 arranged right under the second phosphor layers 64#1 to 64#4 (a second LED group) can be driven independently. Thus, it is possible to adjust the intensity of blue light, and also to appropriately adjust the proportion of the intensities of red and far-red light. It is thus possible to obtain optimum intensities of light, and an optimum proportion of intensities of light, that suit the kind, the growth condition, etc. of a plant. This facilitates plant growth.

In this embodiment, the light emitted from the light emitting device 1 is red, blue, and far-red light. Although far-red light has a very low relative luminous efficiency and the human eye is little sensitive to it, owing to the presence of red and blue light, it is difficult to look straight at the light, and doing so induces a defense reaction, like looking away from it. Thus, as opposed to a light source that emits far-red light alone, it is possible to prevent adverse effects of far-red light on the human eye.

In FIGS. 9 and 10, each row has five LEDs all arrayed in series. Instead, different numbers of LEDs may be arranged in series for different power supply lines (e.g., in FIG. 9, one between the electrode lands 41a and 41k and another between the electrode lands 42a and 42k).

This embodiment provides an effect similar to that brought about by the first and second embodiments. In addition, owing to the first and second phosphor layers being arranged in the shape of strips as seen in a top view so as to reduce the amount of light emitted from one phosphor layer to the other, it is possible to realize a light emitting device that emits red and far-red light efficiently.

Moreover, two light emitting elements, one is for the first phosphor layer and another is for the second phosphor layer, can be driven independently as excitation light source for two phosphor layers. This makes it easy to adjust the intensities, and the proportion of the intensities, of a plurality of types of light (blue, red, and far-red light) having different peak wavelengths. It is thus possible to obtain optimum intensities of light, and an optimum proportion of intensities of light, that suit the kind, the growth condition, etc. of a plant. This facilitates plant growth.

Fourth Embodiment

In the first embodiment described previously, the phosphor layer contains a far-red phosphor. In the second and third embodiments described previously, the first phosphor layer is formed of silicone resin containing a first phosphor (red phosphor) and the second phosphor layer is formed of silicone resin containing a second phosphor (far-red phosphor). These configurations are not meant as any limitation. Any of those phosphor layers may further contain any other substance. This embodiment, though described below as a modified example of the second embodiment, can be applied to the first or third embodiment.

Figure 11:
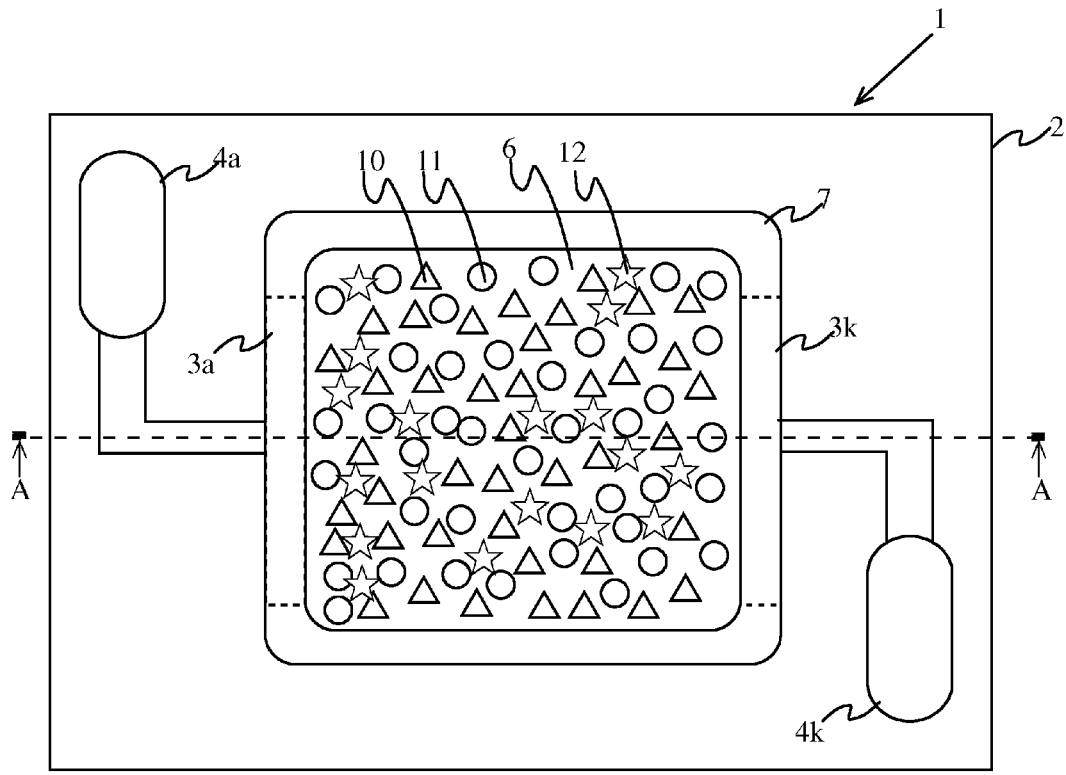
FIG. 11 A top view of a light emitting device according to a fourth embodiment of the present invention.
Figure 12:
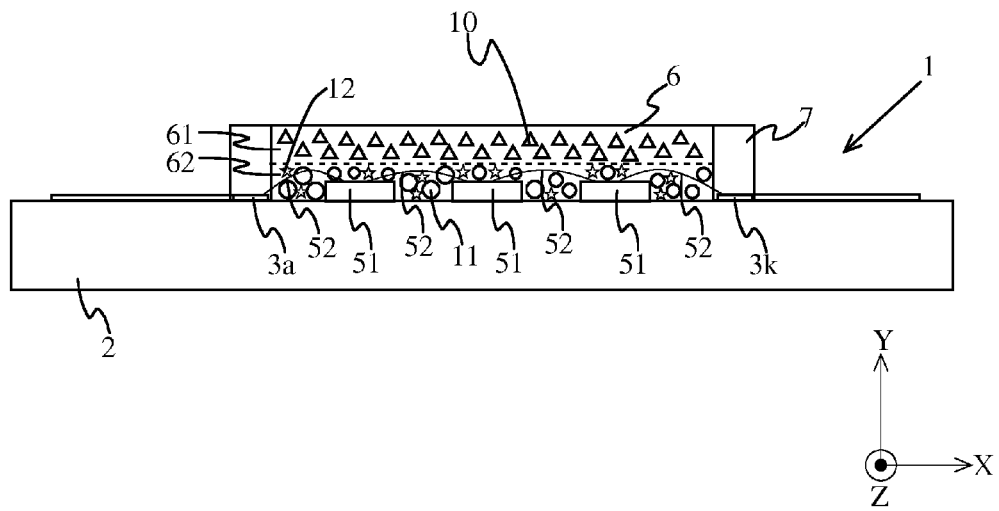
FIG. 12 A side sectional view of the light emitting device shown in FIG. 5, on an XY section across line A-A.

FIG. 11 is a top view of a light emitting element according to a fourth embodiment of the present invention. FIG. 12 is a side sectional view of the light emitting device shown in FIG. 11, on an XY place across line A-A. In FIGS. 11 and 12, star symbols indicate anti-settling agent 12. The anti-settling agent 12 exerts an effect of preventing sedimentation of phosphor in silicone resin. Sedimentation of phosphor in silicone resin leads to an uneven concentration of the phosphor in the silicone resin, and this may cause color unevenness. As a solution, in this embodiment, in addition to a phosphor, an anti-settling agent 12 is added to silicone resin to prevent sedimentation of the phosphor in the silicone resin.

The anti-settling agent 12 can be contained at least in the second phosphor layer 62. This is because the $Gd_3Ga_5O_{12}$:Cr used as the far-red phosphor 11 has a greater specific gravity than the $CaAlSiN_3$:Eu used as the red phosphor 10, and thus the former exhibits a higher sedimentation velocity than the latter in silicone resin. Adding the anti-settling agent 12 to the second phosphor layer 62 helps achieve a uniform concentration of the far-red phosphor 11 in the second phosphor layer 62 (the far-red phosphor 11 is diffused throughout the second phosphor layer 62), and this helps prevent color unevenness. FIGS. 11 and 12 show the light emitting device 1 configured such that the anti-settling agent 12 is contained only in the second phosphor layer 62.

Examples of the anti-settling agent 12 include titanium oxide ($TiO_2$), silica ($SiO_2$), alumina ($Al_2O_3$), calcium carbonate ($CaCO_3$), barium sulfate ($BaSO_4$), and aluminum hydroxide ($Al(OH)_3$).

This embodiment provides an effect similar to that brought about by the first and second embodiments. In addition, forming a phosphor layer such that silicone resin contains an anti-settling agent as well helps achieve a uniform concentration of the phosphor in the phosphor layer. This helps prevent color unevenness.

Fifth Embodiment

In the first embodiment described previously, the phosphor layer is formed of silicone resin containing a far-red phosphor. In the second and third embodiments described previously, the first phosphor layer is formed of silicone resin containing a first phosphor (red phosphor) and the second phosphor layer is formed of silicone resin containing a second phosphor (far-red phosphor). These configurations are not meant as any limitation. Any of those phosphor layers may further contain another phosphor (a third phosphor). This embodiment, though described below as a modified example of the third embodiment, can be applied to the first or second embodiment.

Figure 13:
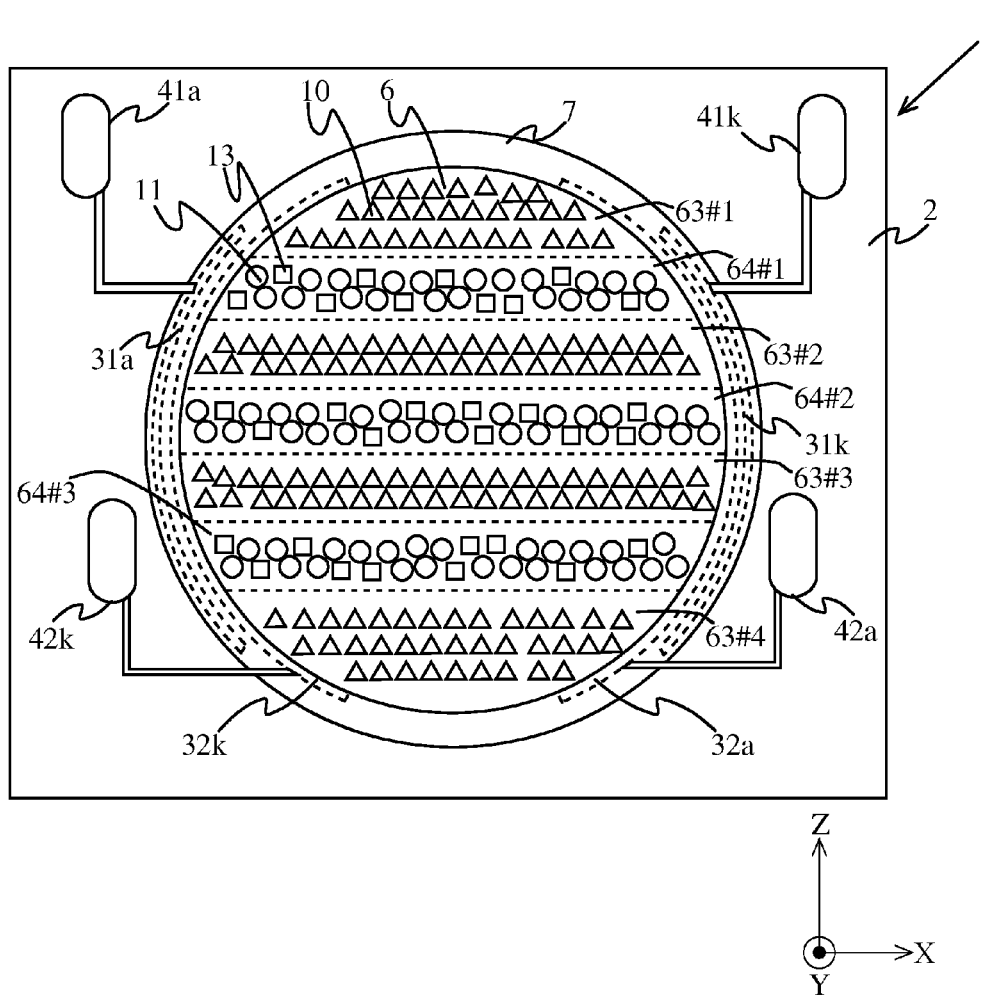
FIG. 13 A top view of a light emitting device according to a fifth embodiment of the present invention.

FIG. 13 is a top view of a light emitting device according to a fifth embodiment of the present invention. In FIG. 13, square symbols indicate a third phosphor 13. The third phosphor 13 can be contained in one or both of the first and second phosphor layers 63 and 64. FIG. 13 shows the light emitting device 1 configured such that the third phosphor 13 is contained only in the second phosphor layer 64.

The third phosphor 13 can be any phosphor that emits light of a color other than red and far-red by excitation with light from the LED 5. Examples include YAG:Ce(($Y_{1-x}Gd_x)_3Al_5O_{12}$:Ce, $0 \leq x \leq 1$), which emits yellow light excited by light from the LED 5; and LuAG:Ce($Lu_3Al_5O_{12}$:Ce, part of Lu may be replaced with Y, Gd, Tb, or the like), which emits green light excited by light from the LED 5.

Owing to the third phosphor 13 being contained in one or both of the first and second phosphor layers 63 and 64, in addition to blue, red, and far-red light, yellow or green light is emitted as well. This makes the light emitted from the light emitting device 1 closer to white light. This makes it possible to grow plants in an environment close to a natural one, and is thus suitable for cases where visual checks are made on leaves of plants being grown, or where decorative plants are grown.

This embodiment provides an effect similar to that brought about by the first and second embodiments. In addition, owing to the third phosphor being contained in one or both of the first and second phosphor layers, the light emitted from the light emitting device is closer to white light. It is thus possible to visually check or enjoy plants in their inherent colors (in their colors in a natural environment).

The fourth and fifth embodiments can be combined. Specifically, an anti-settling agent 12 and a third phosphor 13 may each be contained in one or both of the first and second phosphor layers 63 and 64.

Sixth Embodiment

The first to fifth embodiments described previously deal with light emitting devices of a chip-on-board type. This, however, is not meant as any limitation. A sixth embodiment of the present invention deals with a light emitting device of a mount-lead-cup type. This embodiment, though described below as a modified example of the second embodiment, can be applied to any of the first and third to fifth embodiments.

Figure 14:
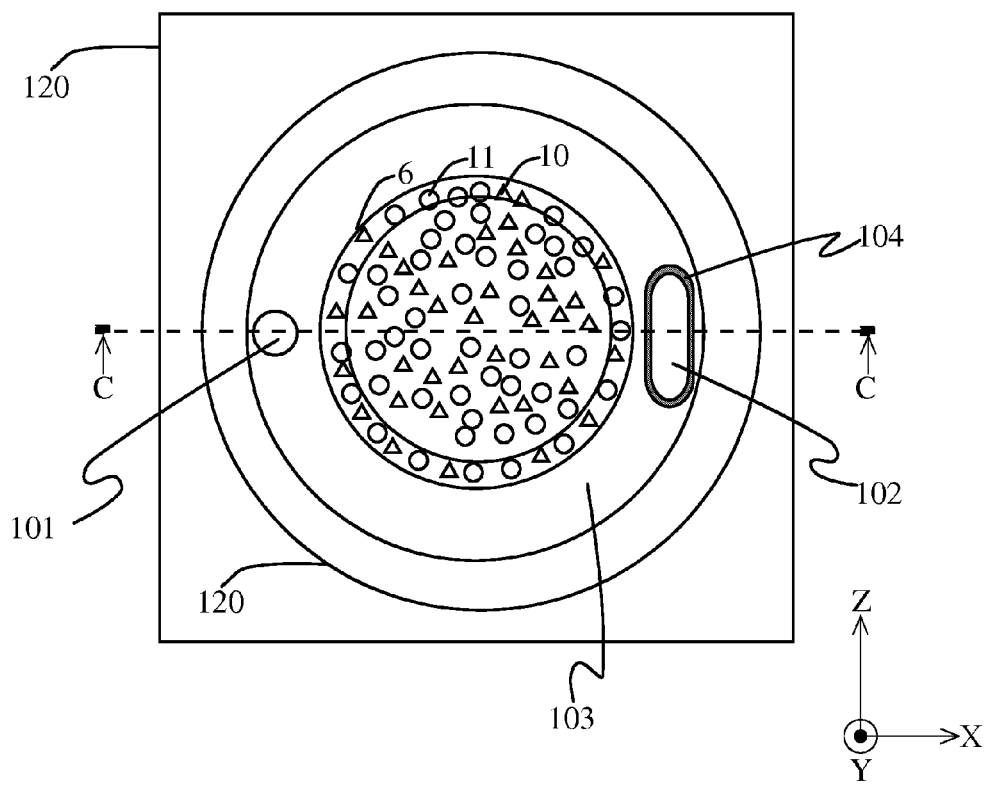
FIG. 14 A top view of a light emitting device according to a sixth embodiment of the present invention.
Figure 15:
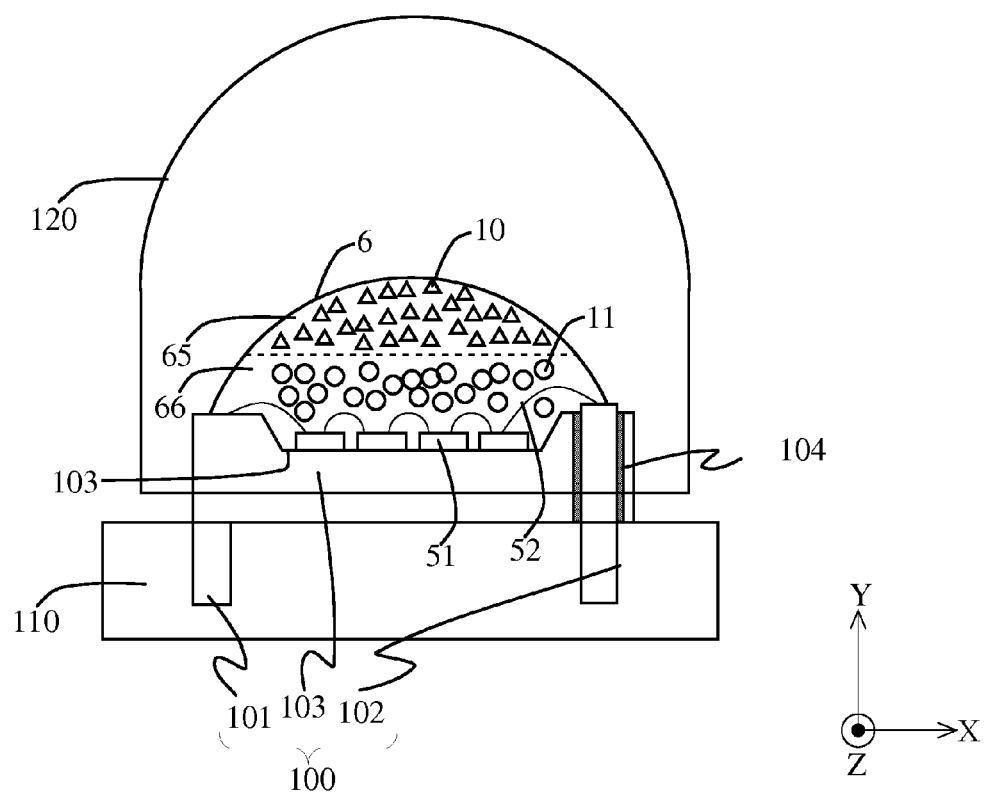
FIG. 15 A side sectional view of the light emitting device shown in FIG. 14, on an XY section across line C-C.
Figure 16:
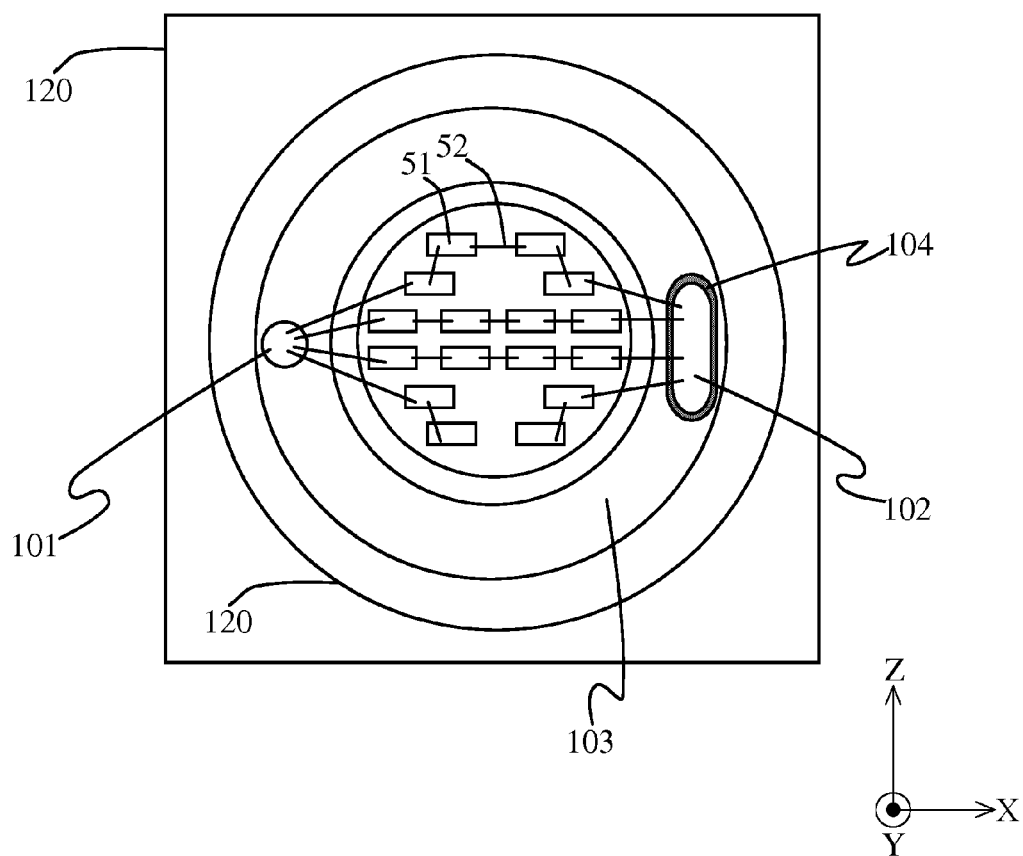
FIG. 16 A top view showing LEDs mounted on a cup in the sixth embodiment.

FIG. 14 is a top view of a light emitting device according to the sixth embodiment. FIG. 15 is a side sectional view of the light emitting device shown in FIG. 14, taken on an XY section along line C-C. FIG. 16 is a top view showing LEDs mounted on a cup in the sixth embodiment. FIG. 16 is the same view as FIG. 14 except that the former omits a phosphor layer and sealing resin.

In this embodiment, the light emitting device 1 includes a leadframe 100, an LED 5, a phosphor layer 6, a heatsink 110, and sealing resin 120. The leadframe 100 is a mounting member on which a light emitting element is mounted. The leadframe 100 has a cathode lead 101, an anode lead 102, and a cup 103. The anode lead 102 is surrounded by an insulating layer 104 and is thereby electrically insulated from the cup 103 to prevent a short circuit between the cathode lead 101 and the anode lead 102. Although in this embodiment the anode lead 102 is covered by the insulating layer 104, the cathode lead 101 may instead be covered by an insulating layer, or both may be covered by insulating layers respectively. The cup 103 has a concave shape open upward, and comprises, for example, a metal cup.

The LED 5 is a light emitting element mounted on a bottom surface 103a inside the cup 103. The LED 5 is composed of gallium nitride-based blue LED chips 51 which emit light having a peak wavelength in a range of 400 nm to 480 nm, more specifically around 450 nm, and which have good temperature and humidity characteristics. There is no particular limitation on the number of LED chips 51 of which the LED 5 is composed; it may be composed of a single LED chip 51, or may be composed of a plurality of LED chips 51, the latter being assumed in this embodiment.

The LED 5 is composed of a plurality of LED chips 51 arrayed in four rows, four LED chips 51 in each row. The four LED chips 51 in each row are electrically connected in series, and the four rows are electrically connected in parallel. Thus, the LED 5 is composed of a total of 16 LED chips 51. This, however, is not meant to limit how the LED chip 51 are electrically connected together and are arrayed in the LED 5.

The LED chips 51 in each row are connected one to the next via a conductive wire 52, and the LED chips 51 at both ends of each row are connected to the cathode lead 101 and the anode lead 102, respectively, each via a conductive wire 52. Although in this embodiment the LED 5 is assumed to emit light having a peak wavelength in a range of 400 nm to 480 nm, this is not meant as any limitation; it may emit light having a peak wavelength in a blue-ultraviolet region covering ultraviolet light.

The phosphor layer 6 is a resin layer which covers the LED 5. The phosphor layer 6 emits light having a peak wavelength in a predetermined wavelength range by excitation light (excitation light) emitted from the LED 5. The phosphor layer 6 is composed of a first phosphor layer 65 and a second phosphor layer 66. The first phosphor layer 65 is formed of sealing resin, which comprises silicone resin, containing a first phosphor 10 (indicated by triangular symbols in FIG. 14, etc.). The second phosphor layer 66 is formed of sealing resin, which comprises silicone resin, containing a second phosphor 11 (indicated by circular symbols in FIG. 14, etc.).

The first and second phosphor layers 65 and 66 are stacked on the bottom surface 103a inside the cup 103 in two layers in the vertical direction (Y direction), with the first phosphor layer 65 formed over the second phosphor layer 66. The first phosphor 10 is a red phosphor that emits light having a peak wavelength in a range of 600 nm to 700 nm by excitation with light from the LED 5. The first phosphor 11 is a far-red phosphor that emits light having a peak wavelength in a range of 700 nm to 800 nm when excited by excitation light from the LED 5.

This embodiment assumes the use, as the red phosphor, of a phosphor based on $CaAlSiN_3$:Eu that emits light having a peak wavelength around 650 nm by excitation with light from the LED 5. This, however, is not meant to limit the type of red phosphor.

On the other hand, the embodiment assumes the use, as the far-red phosphor, of a phosphor based on gadolinium-gallium-garnet that emits light having a peak wavelength around 715 nm by excitation with light from the LED 5. This, however, is not meant to limit the type of far-red phosphor. The far-red phosphor based on gadolinium-gallium-garnet is not limited to $Gd_3Ga_5O_{12}$:Cr or any of its kind expressed by the general formula $(Ln_{1-x}Cr_x)_3M_5O_{12}$ (where Ln is a trivalent metal element, and is at least one element selected from the group consisting of Y, La, Gd, and Lu; M is a trivalent metal element, and is at least one element selected from the group consisting of Al, Ga, and In; x is a number fulfilling the formula $0.005 \le x \le 0.2$). So long as the desired properties are obtained, a composition proportion (e.g., M:O=5:12) may be altered, or a constituent element may be replaced with a similar element, or another element may be added, with a view to enhancing reliability, or adjusting, i.e., increasing or decreasing, emission and absorption spectra. In this embodiment, the far-red phosphor is assumed to be $Gd_3Ga_5O_{12}$:Cr.

While there is no particular limitation on the particle size of the far-red phosphor, it is preferable that the median size (average particle size) be in a range of 1 μm to 20 μm, more preferably in a range of 2 μm to 18 μm, and particularly preferably in a range of 3 μm to 15 μm. This is because, a far-red phosphor based on gadolinium-gallium-garnet with a median size larger than 20 μm tends to produce abnormally grown coarse particles, and is thus difficult to use.

The heatsink 110 has a function of absorbing and diffusing heat (such as transient heat). It is preferable that the heatsink 110 be formed of a metal with high thermal diffusivity, such as copper, a copper alloy, or aluminum. The heatsink 110 absorbs and diffuses the heat that is produced as the LED 5 is driven.

The sealing resin 120 seals one end of each of the cathode and anode leads 101 and 102 along with the phosphor layer 6, etc. into a bullet-form package. Used as the sealing resin 120 is, for example, epoxy resin.

How the proportion of the intensities of blue, red, and far-red light obtained when the LED 5 is lighted is adjusted, and also how the phosphor layer 6 is formed, is the same as in the fourth embodiment.

According to this embodiment, a light emitting device of a mount-lead-cup type provides an effect similar to that brought about by the first to fifth embodiments.

<Spectrum Distribution and Plant Growth>

Figure 17:
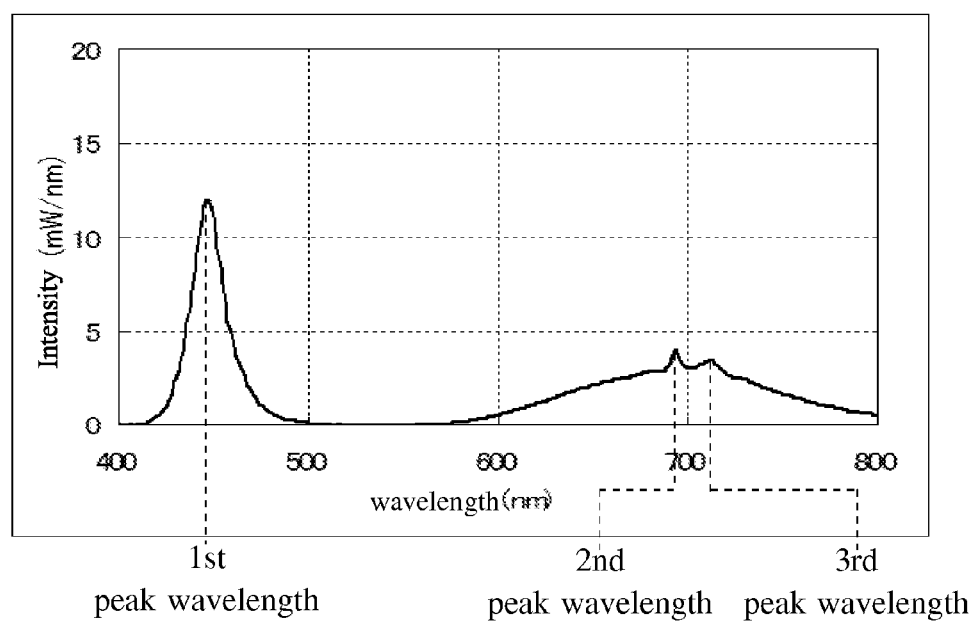
FIG. 17 A diagram showing a spectrum distribution of the light emitted from a light emitting device according to the fifth embodiment.

As a spectrum distribution of the light emitted from a light emitting device 1 according to the embodiments described above, a spectrum distribution observed when all the LEDs 5 are lit in the light emitting device 1 according to the sixth embodiment is shown in FIG. 17. As shown in FIG. 17, the spectrum distribution of the light emitted from the light emitting device 1 has a first peak wavelength in a range of 400 nm to 480 nm, a second peak wavelength in a range of 600 nm to 700 nm, and a third peak wavelength in a range of 700 nm to 800 nm. Thus, the emitted light contains far-red light in addition to blue and red light necessary for proper morphogenesis and photosynthesis in plants. Irradiating plants with far-red and red light simultaneously promotes their photosynthesis due to the Emerson effect.

Moreover, by adjusting the contents of the red and far-red phosphors contained in the phosphor layer(s), or by separately controlling the LEDs arranged under a phosphor layer containing chiefly the red phosphor and the LEDs arranged under a phosphor layer containing chiefly the red phosphor, it is possible to adjust the proportion of the intensities of red and far-red light in the light emitted from the light emitting device 1. It is thus possible to control photomorphogenesis. It is thereby possible to enhance production efficiency of plants, and also to enhance their appearance quality. The light emitting device 1 can thus be effectively used with such agricultural produce as needs to be pleasing to look at, such as floricultural plants.

Moreover, by adjusting the proportion of the intensities of red and far-red light in the light emitted from the light emitting device 1 as mentioned above, it is possible to promote, suppress, and otherwise control flowering. It is thus possible to control production of floricultural plants efficiently (with little loss).

Preferred periods of irradiation of plants with light, and preferred proportions of the intensities of red and far-red light in the light emitted from the light emitting device 1, vary among different cultured varieties and culture environments, and vary with plants' growth condition and stage. With the light emitting device 1, which allows separate control of the LEDs arranged under a phosphor layer containing chiefly the red phosphor and the LEDs arranged right under a phosphor layer containing chiefly the red phosphor, it is possible to easily cope with the given situation. For example, by previously building, on a computer system, data for the management of functions for identifying cultured varieties and for monitoring culture environments, functions for monitoring plants' growth condition and stage, etc., it is possible to control the lighting of LEDs automatically according to the situation, and to adjust the quality, intensity, and other properties of the light emitted from the light emitting device 1.

Moreover, a light emitting device 1 according to the embodiments described above can be built as a compact light emitting device. Thus, using it as an auxiliary light source in plant factories exploiting sunlight helps reduce the area in which sunlight is intercepted. It is thus possible to efficiently grow plants.

On the other hand, light sources for agriculture are often required to offer wide irradiation ranges (irradiation areas); such light sources with wide irradiation ranges are installed at high positions, and are required to offer good light distribution performance. A light emitting device 1 according to the embodiments described above can irradiate a narrow area, and thus allows an efficient light distribution design by use of a lens, a reflector plate, or the like. In that case, emitting blue, red, and far-red light uniformly, the light emitting device 1 is unlikely to suffer from uneven brightness due to a lens, a reflector plate, or the like.

<Supplementary Notes>

In the embodiments described above, the far-red phosphor can be one expressed by the chemical formula $(Ln_{1-x}Cr_x)_3M_5O_{12}$ (where Ln is a trivalent metal element, and is at least one element selected from the group consisting of Y, La, Gd, and Lu; M is a trivalent metal element, and is at least one element selected from the group consisting of Al, Ga, and In; and x is a number fulfilling the formula $0.005 \leq x \leq 0.2$). Specifically, examples include $Y_3Al_{13}O_{12}:Cr$, $Y_3Ga_5O_{12}:Cr$, $Gd_3Al_{15}O_{12}:Cr$, $Y_3Al_{13}O_{12}:Cr$, $Y_3Al_{15}O_{12}:Eu$, $Y_3Al_{15}O_{12}:Cr$, $Y_3Al_{12}Ga_3O_{12}:Cr$, and $Y_3Al_{11}Ga_4O_{12}:Cr$, and the far-red phosphor can be one containing at least one of those.

In the embodiments described above, the red phosphor can be one containing a $CaAlSiN_3:Eu$-based component. Examples of red phosphors containing other components include those containing a $(Sr,Ca)AlSiN_3:Eu$-based component, a $3.5MgO \cdot 0.5MgF_2 \cdot GeO_2:Mn$ component, a $(Ca,Sr)S:(Eu,Ce,K)$ component, and a $M_2Si_5N_8:Eu$ component (where M is at least one element selected from the group consisting of Ca, Sr, and Ba). The red phosphor can be one containing at least one of those.

<Overview>

To follow is an overview of the present invention described hereinbefore.

According to one aspect of the present invention, a light emitting device includes: a light emitting element which emits excitation light; and a far-red phosphor which, by the excitation with light from the light emitting element, emits light having a peak wavelength in a range of 700 nm to 800 nm. Here, the median size of the far-red phosphor is within a range of 1 μm to 20 μm.

With this configuration, the light emitting device has a far-red phosphor emitting far-red light by excitation with light from a light emitting element, and the median size of the far-red phosphor is optimized to be in a range of 1 μm to 20 μm. Providing such a far-red phosphor allows adequate crystal growth, preventing incomplete crystal growth, or abnormal crystal growth resulting in coarse particles. Thus, the light emitting device produces brighter light, and allows more efficient growth of plants.

In the light emitting device configured as described above, preferably, there may be further provided a red phosphor emitting light, having a peak wavelength in a range of 600 nm to 700 nm by the excitation light from the light emitting element.

With this configuration, the light emitting device emits far-red and red light with a simple configuration, and it is thus possible to promote efficient photosynthesis by exploiting the Emerson effect.

In the light emitting device configured as described above, preferably, a phosphor layer containing the far-red phosphor and the red phosphor may be formed so as to reduce the absorption by the far-red phosphor of the light emitted from the red phosphor.

With this configuration, owing to the phosphor layer containing the far-red phosphor and the red phosphor being formed so as to reduce the absorption by the far-red phosphor of the light emitted from the red phosphor, the absorption of red light by the far-red phosphor is reduced.

In the light emitting device configured as described above, preferably, the phosphor layer may have a first phosphor layer in which the concentration of the red phosphor is higher than the concentration of the far-red phosphor, and a second phosphor layer in which the concentration of the far-red phosphor is higher than the concentration of the red phosphor.

With this configuration, the intensity of the red light emitted from the second phosphor layer is zero or low, and thus the attenuation of the intensity of red light due to the absorption of red light by no to a small amount of far-red phosphor contained in the first phosphor layer is very limited.

In the light emitting device configured as described above, preferably, the first phosphor layer may be arranged farther away from the light emitting element than the second phosphor layer is with respect to the emission direction of the excitation light.

With this configuration, it is possible to reduce the amount of light emitted from the first phosphor layer to the second phosphor layer.

In the light emitting device configured as described above, preferably, the first and second phosphor layers may be arranged in a direction perpendicular to the emission direction of the excitation light from the light emitting element.

With this configuration, it is possible to reduce the amount of light emitted from the first phosphor layer to the second phosphor layer.

In the light emitting device configured as described above, preferably, the specific gravity of the far-red phosphor may be larger than the specific gravity of the red phosphor.

With this configuration, owing to the far-red and red phosphors having different sedimentation velocities, when the first and second phosphor layers are arranged in the up/down direction, the concentration of the red phosphor is higher than that of the far-red phosphor in the lower phosphor layer, and the concentration of the far-red phosphor is higher than that of the red phosphor in the lower phosphor layer.

In the light emitting device configured as described above, preferably, the far-red phosphor may have a specific gravity in a range of 6.5 to 7.5, and the red phosphor may have a specific gravity in a range of 2.0 to 4.0.

With this configuration, the difference in sedimentation velocity between the far-red and red phosphors is sufficiently large to speedily form a stacked structure of the first and second phosphor layers.

In the light emitting device configured as described above, preferably, the light emitting element may have a first light emitting element group which emits excitation light to the first phosphor layer, and a second light emitting element group which emits excitation light to the second phosphor layer, and the first and second light emitting element groups may be controllable to be lighted and extinguished individually.

With this configuration, the light emitting elements that emit excitation light to the first phosphor layer and the light emitting elements that emit excitation light to the second phosphor layer can be driven independently. This makes it easy to adjust the intensities, and the proportion of the intensities, of a plurality of types of light (blue, red, and far-red light) having different peak wavelengths. It is thus possible to obtain optimum intensities of light, and an optimum proportion of intensities of light, that suit the kind, the growth condition, etc. of a plant. This facilitates plant growth.

In the light emitting device configured as described above, preferably, there may be further provided an anti-settling agent and/or a phosphor having as a different peak wavelength from the wavelengths of the light emitted from the far-red and red phosphors excited by the light from the light emitting element.

With this configuration, adding an anti-settling agent to silicone resin and forming the phosphor layer out of that silicone resin makes the phosphor concentrations in the phosphor layer uniform. It is thus possible to prevent color unevenness. Moreover, adding a third phosphor to the silicone resin makes the light emitted from the light emitting device closer to white light. It is thus possible to visually check and enjoy plants in their inherent colors (in their colors in a natural environment).

In the light emitting device configured as described above, preferably, the red phosphor may comprise at least one of red phosphors respectively containing a $CaAlSiN_3$:Eu-based component, a $(Sr,Ca)AlSiN_3$:Eu-based component, a $3.5MgO \cdot 0.5MgF_2 \cdot GeO_2$:Mn component, a (Ca,Sr)S:(Eu,Ce,K) component, and a $M_2Si_5N_8$:Eu component (where M is at least one element selected from the group consisting of Ca, Sr, and Ba).

With this configuration, red fluorescence is used, which is suitable for plant growth.

In the light emitting device configured as described above, preferably, the far-red phosphor may comprise a phosphor expressed by the chemical formula $(Ln_{1-x}Cr_x)_3M_5O_{12}$ (where Ln is at least one element selected from the group consisting of Y, La, Gd, and Lu; M is at least one element selected from the group consisting of Al, Ga, and In; x is a number fulfilling the formula $0.005 \leq x \leq 0.2$).

With this configuration, far-red fluorescence is used, which is suitable for plant growth.

In the light emitting device configured as described above, preferably, the light emitting element is an LED element that emits light having a peak wavelength in a range of 400 nm to 480 nm.

With this configuration, it is possible to irradiate plants with blue light, which is important to plant growth.

Preferably, the light emitting device configured as described above may be used for plant cultivation.

With this configuration, it is possible to efficiently grow plants.

INDUSTRIAL APPLICABILITY

The present invention find application in light emitting devices.

LIST OF REFERENCE SIGNS 1 light emitting device
2 substrate
3 conductor pattern
4 electrode land
5 LED (light emitting element)
6 phosphor layer
7 resin frame
10 first phosphor (red phosphor)
11 second phosphor (far-red phosphor)
51 LED chip
52 conductive wire
61, 63, 65 first phosphor layer
62, 64, 66 second phosphor layer

The invention claimed is:
1. A light emitting device comprising:
at least one light emitting element which has a peak wavelength in a range of 400 nm to 480 nm; and
a sealing resin layer which covers the light emitting element, the sealing resin layer including a far-red phosphor which, when excited by excitation light from the light emitting element, emits light having a peak wavelength in a range of 700 nm to 800 nm,
wherein
the sealing resin layer further includes at least one type of red phosphor which, when excited by the excitation light from the light emitting element, emits light having a peak wavelength in a range of 600 nm to 700 nm,
the far-red phosphor has a specific gravity in a range of 6.5 to 7.5, and
the red phosphor has specific gravity in a range of 2.0 to 4.0.
2. The light emitting device of claim 1,
wherein a phosphor layer containing the far-red phosphor and the red phosphor is formed so as to reduce absorption by the far-red phosphor of the light emitted from the red phosphor.
3. The light emitting device of claim 2,
wherein the phosphor layer comprises
a first phosphor layer in which a concentration of the red phosphor is higher than a concentration of the far-red phosphor, and
a second phosphor layer in which a concentration of the far-red phosphor is higher than a concentration of the red phosphor.
4. The light emitting device of claim 3,
wherein the first phosphor layer is arranged farther away from the light emitting element than the second phosphor layer is with respect to an emission direction of the excitation light.
5. The light emitting device of claim 3,
wherein the first and second phosphor layers are arranged in a direction perpendicular to an emission direction of the excitation light from the light emitting element.
6. The light emitting device of claim 5,
wherein the first and second phosphor layers are arranged in a shape of strips as seen in a top view so as to reduce an amount of light emitted from one to the other of the first and second phosphor layers.

7. The light emitting device of claim 3, wherein a specific gravity of the far-red phosphor is larger than a specific gravity of the red phosphor.

8. The light emitting device of claim 3, wherein the light emitting element comprises:
a first light emitting element group which emits excitation light to the first phosphor layer, and
a second light emitting element group which emits excitation light to the second phosphor layer, and
the lighting up and dimming of the first and second light emitting element groups can be controlled individually.

9. The light emitting device of claim 1, further comprising:
an anti-settling agent and/or a phosphor having as a peak wavelength thereof a wavelength different from the wavelengths of the light emitted from the far-red and red phosphors excited by the light from the light emitting element.

10. The light emitting device of claim 1, wherein the red phosphor comprises at least one of red phosphors respectively containing a $CaAlSiN_3$:Eu-based component, a $(Sr,Ca)AlSiN_3$:Eu-based component, a $3.5MgO.0.5MgF_2.GeO_2$:Mn component, a $(Ca, Sr)S$:(Eu,Ce,K) component, and a $M_2Si_5N_8$:Eu component (where M is at least one element selected from the group consisting of Ca, Sr, and Ba).

11. The light emitting device of claim 1, wherein the red phosphor comprises a first red phosphor which, when excited by the light from the light emitting element, emits light having a peak wavelength around 650 nm.

12. The light emitting device of claim 1, wherein the far-red phosphor comprises a phosphor expressed by a chemical formula $(Ln_{1-x}Cr_x)_3M_5O_{12}$ (where Ln is at least one element selected from the group consisting of Y, La, Gd, and Lu; M is at least one element selected from the group consisting of Al, Ga, and In; x is a number fulfilling the formula $0.005 \leq x \leq 0.2$).

13. The light emitting device of claim 1, wherein the light emitting device is used for plant cultivation.

14. A light emitting device comprising,
at least one light emitting element which has a peak wavelength in a range of 400 nm to 480 nm; and
a sealing resin layer which covers the light emitting element, the sealing resin layer including a far-red phosphor which, when excited by excitation light from the light emitting element, emits light having a peak wavelength in a range of 700 nm to 800 nm,
wherein
the sealing resin layer further includes at least one type of red phosphor which, when excited by the excitation light from the light emitting element, emits light having a peak wavelength in a range of 600 nm to 700 nm,
the red phosphor comprises a first red phosphor which, when excited by the excitation light from the light emitting element, emits light having a peak wavelength around 650 nm, and
in addition to the first red phosphor, the red phosphor further comprises a second red phosphor which, when excited by the light from the light emitting element, emits light having a shorter peak wavelength than the first red phosphor does.

15. A light emitting device comprising:
at least one light emitting element which has a peak wavelength in a range of 400 nm to 480 nm; and
a sealing resin layer which covers the light emitting element, the sealing resin layer including a far-red phosphor which, when excited by excitation light from the light emitting element, emits light having a peak wavelength in a range of 700 nm to 800 nm,
wherein
the sealing resin layer further includes at least one type of red phosphor which, when excited by the excitation light from the light emitting element, emits light having a peak wavelength in a range of 600 nm to 700 nm, and
the light emitting device further comprises an anti-settling agent and/or a phosphor having as a peak wavelength thereof a wavelength different from the wavelengths of the light emitted from the far-red and red phosphors excited by the excitation light from the light emitting element.

16. The light emitting device of claim 15, wherein the phosphor having as the peak wavelength thereof the wavelength different from the wavelengths of the light emitted from the far-red and red phosphors excited by the excitation light from the light emitting element is $Lu_3Al_5O_{12}$:Ce.

* * * * *